United States Patent
Lin et al.

(10) Patent No.: US 12,317,682 B2
(45) Date of Patent: *May 27, 2025

(54) DISPLAY DEVICE INCLUDING BLUE ORGANIC LIGHT EMITTING DIODE AND BLUE LIGHT BLOCKING LAYER

(71) Applicant: InnoLux Corporation, Miao-Li County (TW)

(72) Inventors: Hsiao-Lang Lin, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 83 days.

This patent is subject to a terminal disclaimer.

(21) Appl. No.: 18/120,418

(22) Filed: Mar. 12, 2023

(65) Prior Publication Data
US 2023/0217711 A1    Jul. 6, 2023

Related U.S. Application Data

(63) Continuation of application No. 17/105,532, filed on Nov. 26, 2020, now Pat. No. 11,626,460.
(Continued)

(30) Foreign Application Priority Data
Jul. 30, 2020  (CN) .......................... 202010747976.0

(51) Int. Cl.
*H01L 29/08*       (2006.01)
*H10K 50/814*   (2023.01)
(Continued)

(52) U.S. Cl.
CPC ....... *H10K 59/1213* (2023.02); *H10K 50/814* (2023.02); *H10K 50/824* (2023.02); *H10K 59/1216* (2023.02)

(58) Field of Classification Search
CPC ............. H10K 59/1216; H10K 50/814; H10K 50/824; H01K 59/1213
(Continued)

(56) References Cited

U.S. PATENT DOCUMENTS 10,050,098 B2    8/2018  Nam
10,373,978 B2    8/2019  Lee
(Continued)

FOREIGN PATENT DOCUMENTS

CN          107039491 A      8/2017
CN          107507906 A     12/2017
(Continued)

*Primary Examiner* — Phuc T Dang
(74) *Attorney, Agent, or Firm* — Winston Hsu

(57) ABSTRACT

A display device includes a first inorganic layer disposed on a substrate, a thin film transistor disposed on a first inorganic layer including a semiconductor, a gate, a source and a drain, a storage capacitor including a first electrode and a second electrode, a first organic layer disposed on the thin film transistor and including a contact via, a second inorganic layer disposed between the gate and the semiconductor, a third inorganic layer disposed between the source and the gate, a light emitting diode including an anode electrically connected with the source through the contact via, a cathode and a light emitting layer, a first sealing layer disposed on the light emitting diode, a wavelength conversion layer disposed on the first sealing layer, and a blue light blocking layer disposed on the wavelength conversion layer. The second electrode is disposed between the third inorganic layer and the first organic layer.

9 Claims, 17 Drawing Sheets

Related U.S. Application Data

(60) Provisional application No. 62/953,464, filed on Dec. 24, 2019.

(51) Int. Cl.
*H10K 50/824* (2023.01)
*H10K 59/121* (2023.01)

(58) Field of Classification Search
USPC .......................................................... 257/40
See application file for complete search history.

(56) References Cited

U.S. PATENT DOCUMENTS

| | | | |
|---|---|---|---|
| 11,626,460 B2 * | 4/2023 | Lin | H10K 59/80522 |
| | | | 257/40 |
| 2016/0064685 A1 * | 3/2016 | Kim | B32B 37/003 |
| | | | 428/137 |
| 2016/0197132 A1 * | 7/2016 | Cho | H01L 23/5225 |
| | | | 257/40 |
| 2018/0182836 A1 * | 6/2018 | Beak | H10K 59/1216 |
| 2020/0091464 A1 * | 3/2020 | Park | H10K 50/125 |

FOREIGN PATENT DOCUMENTS

| | | |
|---|---|---|
| CN | 109148513 A | 1/2019 |
| KR | 10-2015-0080158 | 7/2015 |
| KR | 10-2017-0078175 | 7/2017 |
| KR | 10-2018-0078813 | 7/2018 |
| KR | 10-2018-0087908 | 8/2018 |

\* cited by examiner

DISPLAY DEVICE INCLUDING BLUE ORGANIC LIGHT EMITTING DIODE AND BLUE LIGHT BLOCKING LAYER

CROSS REFERENCE TO RELATED APPLICATIONS

This application is a continuation application of U.S. application Ser. No. 17/105,532, filed on Nov. 26, 2020, U.S. Pat. No. 11,626,460 which claims the benefit of U.S. Provisional Application No. 62/953,464, filed on Dec. 24, 2019. The contents of these applications are incorporated herein by reference.

BACKGROUND OF THE DISCLOSURE

1. Field of the Disclosure

The present disclosure relates to a display device, and more particularly to a display device with a light emitting diode.

2. Description of the Prior Art

In an electronic (display) device, a capacitor is provided so that a thin film transistor may have a stable voltage during the operation of each frame. If the space for a capacitor is too limited to have the needed capacitance value, the brightness uniformity of the display may be affected. In addition, when a transparent conductive material is used in the cathode of an organic light emitting diode, the higher impedance of the transparent conductive material affects the voltage distribution, and the insufficient voltage causes IR drop. Some electronic devices are equipped with auxiliary electrodes to reduce the aforementioned IR drop problem. However, under the coexistence of capacitors and auxiliary electrodes, an interference may occur between the capacitor and the auxiliary electrode. The interference need to be improved.

SUMMARY OF THE DISCLOSURE

In view of this, the present disclosure proposes a display device to solve the technical problems in the field.

According to an embodiment of the present disclosure, A display device includes a substrate, a first inorganic layer, a thin film transistor, a storage capacitor, a first organic layer, a second inorganic layer, a third inorganic layer, a light emitting diode, a first sealing layer, a wavelength conversion layer and a blue light blocking layer. The first inorganic layer is disposed on the substrate. The thin film transistor is disposed on the first inorganic layer, and includes a semiconductor, a gate electrode overlapping the semiconductor, a source electrode and a drain electrode electrically connected with the semiconductor. The storage capacitor includes a first electrode and a second electrode. The first electrode is electrically insulated from the second electrode and overlapped with the second electrode. The first organic layer is disposed on the thin film transistor and includes a contact via. The second inorganic layer is disposed between the gate electrode and the semiconductor. The third inorganic layer is disposed between the source electrode and the gate electrode. The light emitting diode includes an anode, a cathode, and a light emitting layer disposed therebetween. The light emitting layer is electrically connected with the anode and the cathode, and the anode is electrically connected with the source electrode through the contact via. The first sealing layer is disposed on the light emitting diode. The wavelength conversion layer is disposed on the first sealing layer. The blue light blocking layer is disposed on the wavelength conversion layer. The second electrode of the storage capacitor is disposed between the third inorganic layer and the first organic layer.

These and other objectives of the present disclosure will no doubt become obvious to those of ordinary skill in the art after reading the following detailed description of the embodiment that is illustrated in the various figures and drawings.

DETAILED DESCRIPTION

Figure 1A:
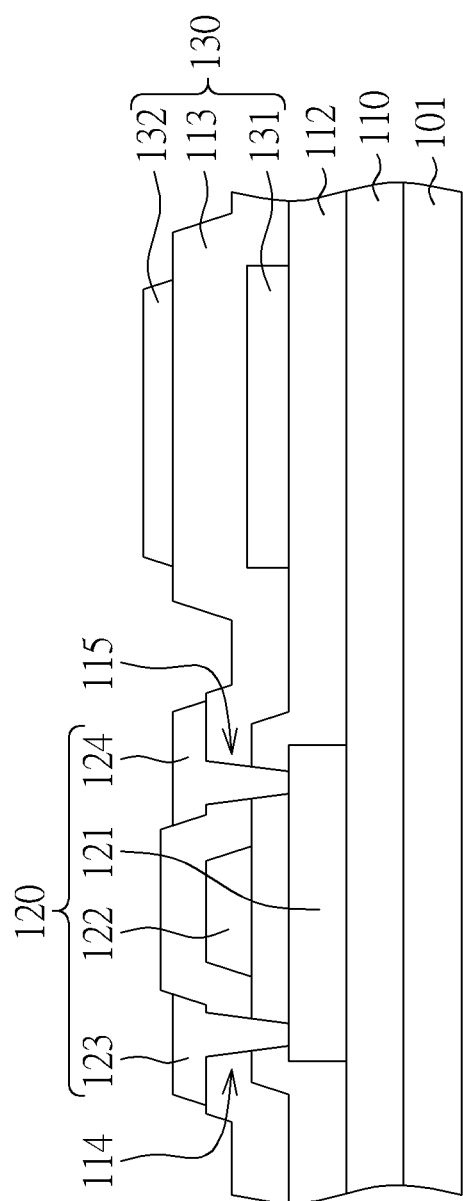
FIG. 1A, FIG. 1B, and FIG. 1C are schematic diagrams of cross-sectional structures of the display device in different manufacturing stages according to the first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure. In addition, similar and/or corresponding numeral references may be used in different embodiments. They are used for a simple and clear description of some embodiments, and do not imply that there is any connection between the different embodiments and/or structures discussed.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

The directional terms mentioned in this article, such as "on", "below", "front", "rear", "left", "right", etc., only refer to the directions of the drawings. In the drawings, each drawing depicts the general features of the methods, structures and/or materials used in specific embodiments. However, these drawings should not be construed as defining or limiting the scope or nature in these embodiments. For example, in terms of clarity, the relative size, thickness, and position of each layer, region, and/or structure may be reduced or enlarged.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In this disclosure, the thickness, the length and the width may be measured by using an optical microscope, and the thickness may be measured by a cross-sectional image in an electron microscope, but the present disclosure is not limited thereto. In addition, there may be a certain error between any two values or directions used for comparison. If the first value is equal to the second value, it implies that there may be an error of about 10% between the first value and the second value. If the first direction is perpendicular to the second direction, the angle between the two may be between 80 degrees and 100 degrees. If the first direction is parallel to the second direction, the angle between the first direction and the second direction may be between 0 degree and 10 degrees. Unless otherwise defined, all terms (including technical terms and scientific terms) used herein have the same meanings as commonly understood by those persons having ordinary skill in the art to which this disclosure belongs. It is understandable that these terms, such as those defined in commonly used dictionaries, should be interpreted as having meanings consistent with the relevant technology and the background or context of this disclosure, and should not be interpreted in an idealized or excessively formal way unless they are specifically defined in the embodiments of the present disclosure.

When a component or a film layer is referred to as "disposed on another component or another film layer" or "connected to (or with) another component or another film layer", it can mean that the component or film layer is directly disposed on another On a component or film layer, or directly connected to (or with) another component or film layer, or there may be other components or film layers in between. In contrast, when a component is said to be "directly disposed on another component or film" or "directly connected to (or with) another component or film", there is no component or film between the two.

It should be noted that the technical solutions provided by the different embodiments below may be used interchangeably, combined or mixed to form another embodiment without violating the gist of the disclosure. When a part (or a film layer) overlaps another part (or another film layer), it means that a part (or a film layer) and another part (or another film layer) are in the upper direction Overlapped.

Figure 1B:
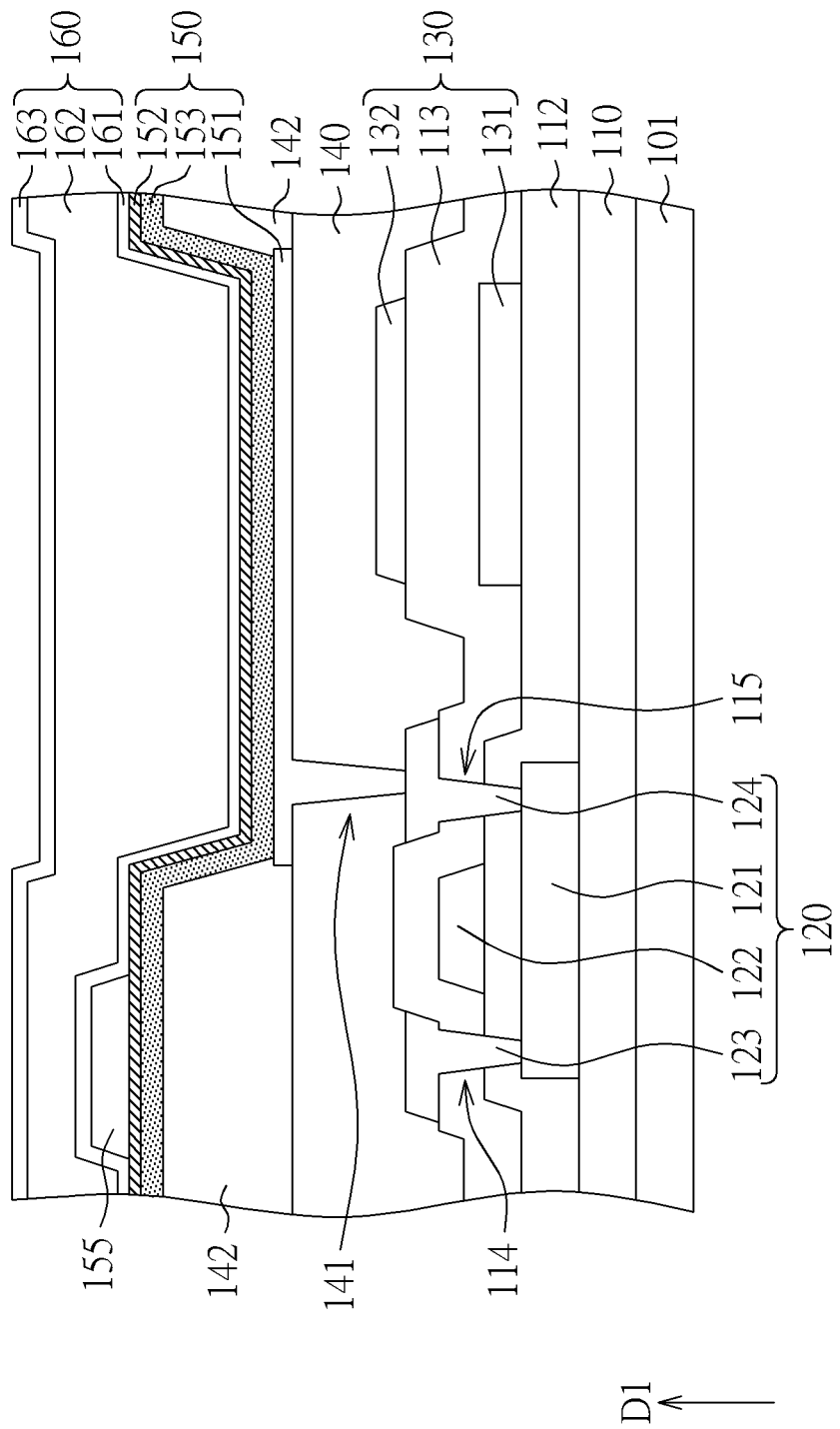
Figure 1C:
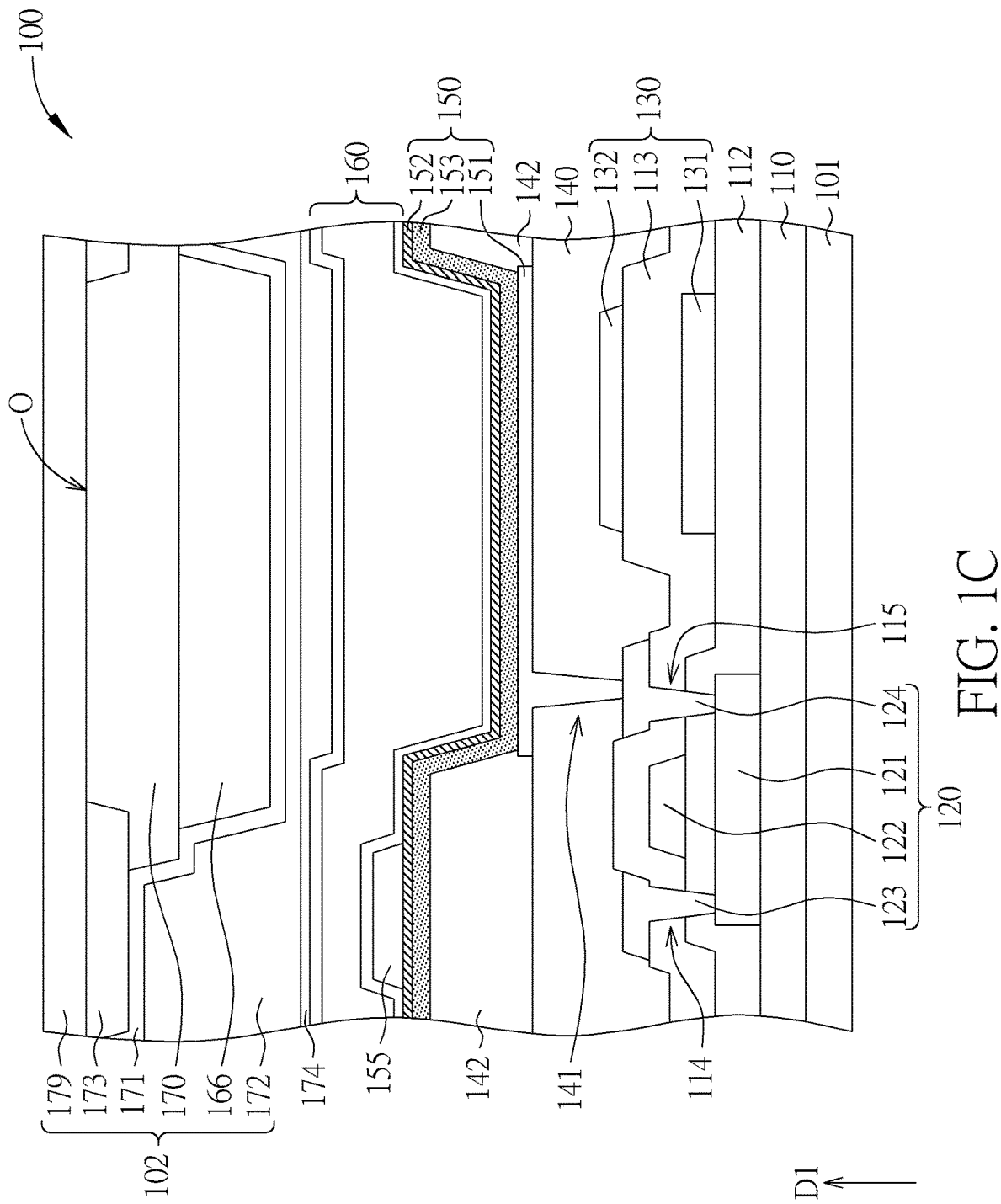

FIG. 1A, FIG. 1B, and FIG. 1C are schematic diagrams of cross-sectional structures of the display device 100 in different manufacturing stages according to the first embodiment of the present disclosure. The display device 100 may include a substrate 101, a thin film transistor 120, a storage capacitor 130, and a blue organic light emitting diode 150, but the present disclosure is not limited thereto. The display device 100 may include a first inorganic layer 110, a first organic layer 140, a first sealing layer 160, a wavelength conversion element 166, a blue light blocking element 170, and a second sealing layer 179. The electronic device may include a display device, an antenna device, a sensing device, a light emitting device and/or a tiling type device, but the present disclosure is not limited thereto. The display device 100 may include a bendable or flexible device. The display device 100 may include an organic light emitting diode (OLED), a quantum dot light emitting diode (such as QLED or QDLED), fluorescence, phosphor, other suitable materials or a combination thereof, but the present disclosure is not limited thereto. The substrate 101 may include a substrate layer. For example, the substrate 101 may include a hard substrate or a flexible substrate. The materials of the substrate 101 may include glass, ceramic, polyimide (PI) or polyethylene terephthalate (PET), other suitable materials or a combination thereof, but the present disclosure is not limited thereto.

In some embodiments, the first inorganic layer 110 may be disposed on the substrate 101 and the thin film transistor 120 may be disposed on the first inorganic layer 110. It should be noted that "the thin film transistor 120 is disposed on the first inorganic layer 110" refers to that one of the components of the thin film transistor 120 may be disposed on the first inorganic layer 110.

In some embodiments, the first inorganic layer 110 may be a single material layer, and other layers may be selectively provided between the first inorganic layer 110 and the substrate 101, or the first inorganic layer 110 may directly contact the substrate 101. In some embodiments, the thin film transistor 120 may be a switching element, a driving element or a transistor with other functions, but the present disclosure is not limited thereto. The thin film transistor 120 may include a metal oxide semiconductor 121, a gate electrode 122 overlapping the metal oxide semiconductor 121, a source electrode 124 and a drain electrode 123 which may be electrically connected with the metal oxide semiconductor 121, but the present disclosure is not limited thereto. The metal oxide semiconductor 121 may include an indium gallium zinc oxide (IGZO), other suitable materials, or a combination thereof, but the present disclosure is not limited thereto. The metal oxide semiconductor 121 may be defined to be a channel. In the top view direction D1 (the normal direction of the surface of the substrate 101), the metal oxide semiconductor 121 at least partially overlaps the gate electrode 122, and a dielectric material may be provided (or disposed) between the metal oxide semiconductor 121 and the gate electrode 122 as a gate dielectric layer. The gate dielectric layer may be the second inorganic layer 112, but is not limited to this, and may be optionally adjusted. The structure of the thin film transistor in the present disclosure is for example only, and the types or structures of the thin film transistor may be optionally adjusted. In some embodiments, the storage capacitor 130 may include a first electrode 131 and a second electrode 132. The first electrode 131 may be electrically insulated from the second electrode 132 and overlap with the second electrode 132. The first electrode 131 may be electrically connected with the gate electrode 122; the second electrode 132 may be electrically connected with the source electrode 123. Specifically speaking, a dielectric material layer may be provided (or disposed) between the first electrode 131 and the second electrode 132 so that the first electrode 131 may be electrically insulated from the second electrode 132. In the embodiment, the dielectric material layer may include a third inorganic layer 113, but the present disclosure is not limited thereto. In some embodiments, in the top view direction D1, the first electrode 131 and the second electrode 132 may completely overlap or partially overlap with each other. The materials of the first inorganic layer 110, the second inorganic layer 112 and/or the third inorganic layer 113 may include insulating materials, such as silicon nitride, silicon oxide, silicon oxynitride, other suitable materials or a combination thereof, but the present disclosure is not limited thereto. The first inorganic layer 110, the second inorganic layer 112, and/or the third inorganic layer 113 may include the same material or different materials. In other embodiments (not shown), the second electrode 132 may be electrically connected to the drain electrode 123. In some embodiments (as shown in FIG. 1A), the first electrode 131 and the gate electrode 122 may be formed of the same conductive layer, and the second electrode 132, the source electrode 124 and/or drain electrode 123 may be formed of the same conductive layer, but it is not limited thereto.

In some embodiments, the first organic layer 140 may be disposed on the thin film transistor 120 and may include a contact via 141. The contact via 141 may partially overlap the thin film transistor 120 (such as the source electrode 124, but not limited thereto). In some embodiments, the first organic layer 140 may be a planarization layer. As shown in FIG. 1A, the second inorganic layer 112 may be disposed between the gate electrode 122 and the metal oxide semiconductor 121, and the third inorganic layer 113 may be disposed between the source electrode 124 (and/or the drain electrode 123) and the gate electrode 122. In some embodiments, the first electrode 131 of the storage capacitor 130 may be disposed between the second inorganic layer 112 and the third inorganic layer 113, and the second electrode 132 of the storage capacitor 130 may be disposed between the third inorganic layer 113 and the first organic layer 140, but it is not limited thereto. It should be noted that the positions of the first electrode 131 and the second electrode 132 may be interchanged. In some embodiments, the blue organic light emitting diode 150 may include an anode 151, a cathode 152, and a blue organic light emitting layer 153 disposed therebetween, and the blue organic light emitting layer 153 may be electrically connected to the anode 151 and to the cathode 152. In some embodiments, the anode 151 may be electrically connected to the source electrode 124 through the contact via 141, but the present disclosure is not limited thereto. In some embodiments (not shown), the anode 151 may be electrically connected to one of the source electrode 124 and the drain electrode 123. In some embodiments, the main wavelength of the emission spectrum of the blue organic light emitting layer 153 may be between 400 nm (nanometer) and 490 nm (400 nm main wavelength 490 nm), but it is not limited thereto. In some embodiments (not shown), the blue organic light emitting layer 153 may include a hole injection layer (HIL), a hole transport layer (HTL), a light emission layer (EL), an electron transport layer (ETL), an electron injection layer (EIL) and/or charge generation layer (CGL), but it is not limited thereto. In some embodiments, although only one blue organic light emitting diode 150 is illustrated in FIG. 1B and in FIG. 1C, the display device 100 may include a plurality of blue organic light emitting diodes 150, and the cathode 152 may be used as a common cathode layer of a plurality of blue organic light emitting diodes 150, but it is not limited thereto. In some embodiments, the first sealing layer 160 may be disposed on the blue organic light emitting diode 150. The first sealing layer 160 may include a transparent material, an organic or inorganic insulating layer material, but it is not limited thereto. The first sealing layer 160 may have moistproof, filling and/or covering properties, but it is not limited thereto. In some embodiments, the refractive index of the first sealing layer 160 and the refractive index of the adjacent layer may match to facilitate blue light emission. The first sealing layer 160 may include a single layer or a composite layer, such as a stacking layer of the inorganic layer 161, the organic layer 162 and the inorganic layer 163 (IOI), but it is not limited thereto. The wavelength conversion element 166 may be disposed on the first sealing layer 160. The wavelength conversion element 166 may convert blue light into wavelength light of other colors, such as green light, red light or light of other suitable color, but it is not limited thereto. The wavelength conversion element 166 may include quantum dots, phosphor materials, fluorescence materials, pigments, dyes, scattering particles, filter layers, other suitable materials or a combination thereof, but it is not limited thereto. The blue blocking element 170 may be disposed on the wavelength conversion element 166 to block, absorb or filter the light which is not converted by the wavelength conversion element 166 to improve the color quality of the output light. It should be noted that the display device 100 may include a plurality of sub-pixels, and each sub-pixel may correspond to a blue organic light emitting diode 150. When the sub-pixel is a red sub-pixel or a green sub-pixel, the wavelength conversion element 166 which corresponds to the organic light emitting diode 150 in the sub-pixel may convert the blue light emitted by the blue organic light emitting diode 150 into red light or green light, but it is not limited thereto. When the sub-pixel is a blue sub-pixel, the blue blocking layer 170 and/or the wavelength conversion element 166 may optionally not be provided (or disposed) on the blue organic light emitting diode 150 in the sub-pixel, or these two layers may be replaced with other transparent filling layers, but it is not limited thereto. In addition, the second sealing layer 179 may be disposed on the blue light blocking element 170 to protect the layers below the second sealing layer 179. In some embodiments, the second sealing layer 179 may include an organic insulating layer or an inorganic insulating layer, but it is not limited thereto. In some embodiments, if the second sealing layer 179 is the outermost layer, the second sealing layer 179 may optionally include a protective cover. The protective cover may have a protective or scratch-resistant function.

The manufacturing process of the display device 100 of the first embodiment is briefly described as follows, but it is not limited thereto. Please refer to FIG. 1A, a first inorganic layer 110 and a metal oxide semiconductor layer (not shown) may be disposed on a substrate 101, and the metal oxide semiconductor layer may be patterned to obtain a metal oxide semiconductor 121. Next, a second inorganic layer 112 and a first conductive layer (not shown) may be disposed on the first inorganic layer 110, and the first conductive layer may be patterned to obtain the first electrode 131 and the gate electrode 122, but it is not limited thereto. In other words, the first electrode 131 and the gate electrode 122 may be formed of the same conductive layer. The above configuration may simplify the manufacturing process. Then, a third inorganic layer 113 may be disposed on the second inorganic layer 112, and the third inorganic layer 113 may be patterned to obtain a first conductive via 114 and a second conductive via 115. Next, a second conductive layer (not shown) may be disposed on the third inorganic layer 113, and the second conductive layer may be patterned to obtain the second electrode 132, the source electrode 124 and/or the drain electrode 123, and a portion of the source electrode 124 may be disposed in the first conductive via 115, a portion of the drain electrode 123 may be disposed in the second conductive via 114, but it is not limited thereto. In other words, the second electrode 132, the source electrode 124, and/or the drain electrode 123 may be formed of the same conductive layer, and the above configuration may simplify the manufacturing process. In some embodiments, the thin film transistor 120 may include a metal oxide semiconductor 121, a gate electrode 122, a source electrode 124, a drain electrode 123 and a portion of the second inorganic layer 112, but it is not limited thereto. In some embodiments, the storage capacitor 130 may include a first electrode 131, a second electrode 132 and a portion of the third inorganic layer 113, but it is not limited thereto. The dielectric layer (for example, the third inorganic layer 113) disposed between the first electrode 131 and the second electrode 132 of the storage capacitor 130 may be optionally adjusted. In some embodiments, in the top view direction D1, the storage capacitor 130 may not overlap the thin film transistor 120 to reduce the interference between the storage capacitor 130 and the thin film transistor 120.

Please refer to FIG. 1B, a first organic layer 140 may be disposed on the thin film transistor 120. The first organic layer 140 may be used as a planarization layer, and the first organic layer 140 may be patterned to form a contact via 141. Then, a third conductive layer (not shown) may be disposed on the first organic layer 140, a portion of the third conductive layer may be filled in the contact via 141, and then the third conductive layer may be patterned to obtain an anode 151 of the blue organic light emitting diode 150. Next, a patterned second organic layer 142 may be disposed to expose a portion of the anode 151, and the patterned second organic layer 142 may be used as a pixel definition layer (PDL). Then, the blue organic light emitting layer 153 and the cathode 152 may be disposed to complete the production of the blue organic light emitting diode 150. Later, the first sealing layer 160 may be disposed on the blue organic light emitting diode 150. In some embodiments, the auxiliary electrode 155 may be selectively disposed in the structure shown in FIG. 1B. For the details of the auxiliary electrode 155, please refer to the descriptions in the subsequent embodiments.

Next, referring to FIG. 1C, a second substrate structure 102 may be formed. In some embodiments, the second substrate structure 102 may include a composite laminated structure. For example, the second substrate structure 102 may include a second sealing layer 179, a light shielding layer 173, a blue light blocking element 170, a wavelength conversion element 166, an insulating layer 171 and/or a planarization layer 172, but it is not limited thereto. In other embodiments, other elements may be selectively added to the second substrate structure 102 or the aforementioned elements may be selectively removed. In some embodiments, the planarization layer 172 may include a transparent material, the refractive index of the planarization layer 172 and the refractive index of an adjacent layer may match to facilitate the light emission. In some embodiments, the planarization layer 172 may include an organic material, but it is not limited thereto. In some embodiments, the materials of the light shielding layer 173 may include a black photoresist, a black resin, other suitable materials or a combination thereof, but it is not limited thereto. In some embodiments, the second substrate structure 102 may be formed with reference to the following descriptions. For example, a patterned light shielding layer 173 may be disposed on the second sealing layer 179 (such as a base plate). In the top view direction D1, the pattern of the light-shielding layer 173 may not overlap the blue organic light emitting diode 150 (that is, misaligned with each other), and the openings O between the patterns of the light-shielding layer 173 may be selectively disposed with the blue light blocking element 170 and/or the wavelength conversion element 166. The blue light blocking element 170 may be disposed between the second sealing layer 179 and the wavelength conversion element 166, but it is not limited thereto. Next, an insulating layer 171 may be disposed to cover the light shielding layer 173, the blue blocking element 170 and/or the wavelength conversion element 166. Then, a planarization layer 172 may be disposed on the insulating layer 171, so that the second substrate structure 102 may have a flat surface to facilitate the subsequent attachment to the substrate 101 with the layers disposed on the substrate 101. Later, the second substrate structure 102 is attached to the substrate 101. After the attachment is completed, in the top view direction D1, the wavelength conversion element 166 may roughly overlap the blue organic light emitting diode 150, the term "overlap" includes partial overlap and complete overlap. A filling layer 174 may be selectively disposed between the second substrate structure 102 and the substrate 101, and the filling layer 174 may include an adhesive material to attach the second substrate structure 102 to the substrate 101, to reduce the offset problem between second substrate structure 102 and the substrates 101. After the second substrate structure 102 and the substrate 101 are aligned and attached, the display device 100 of the first embodiment shown in FIG. 1C may be obtained. In some embodiments, the filling layer 174 may include an optically functional layer to guide the light emitted by the blue organic light emitting diode 150 to the wavelength conversion element 166 to improve light efficiency, but it is not limited thereto.

The display device of the present disclosure is not limited to the above-mentioned embodiments. Other embodiments of the present disclosure are described as follows. In order to simplify the descriptions and highlight the differences between the embodiments, the same reference numerals may be used to label the same elements in the following, and similar descriptions may be omitted. In addition, please refer to the above embodiments for the conditions of each film, layers, materials and process steps in the subsequent embodiments, and they will not be elaborated again.

Figure 2A:
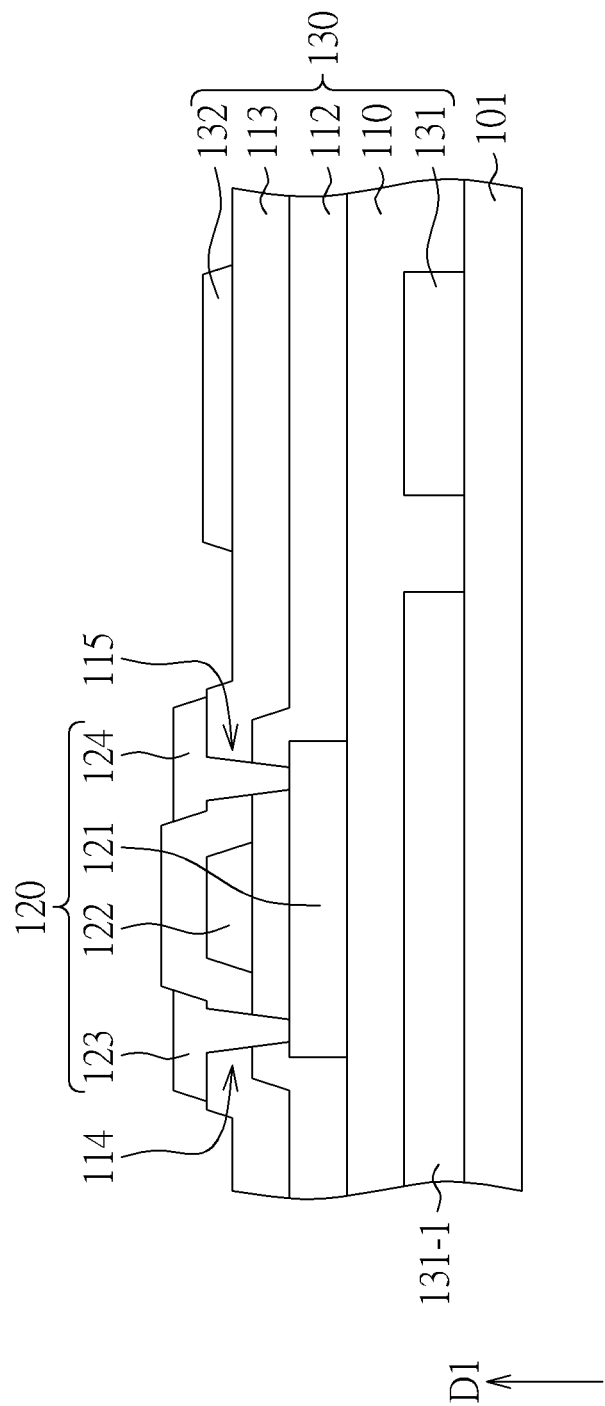
FIG. 2A and FIG. 2B are schematic diagrams of the cross-sectional structures of the display device according to the second embodiment of the present disclosure.
Figure 2B:
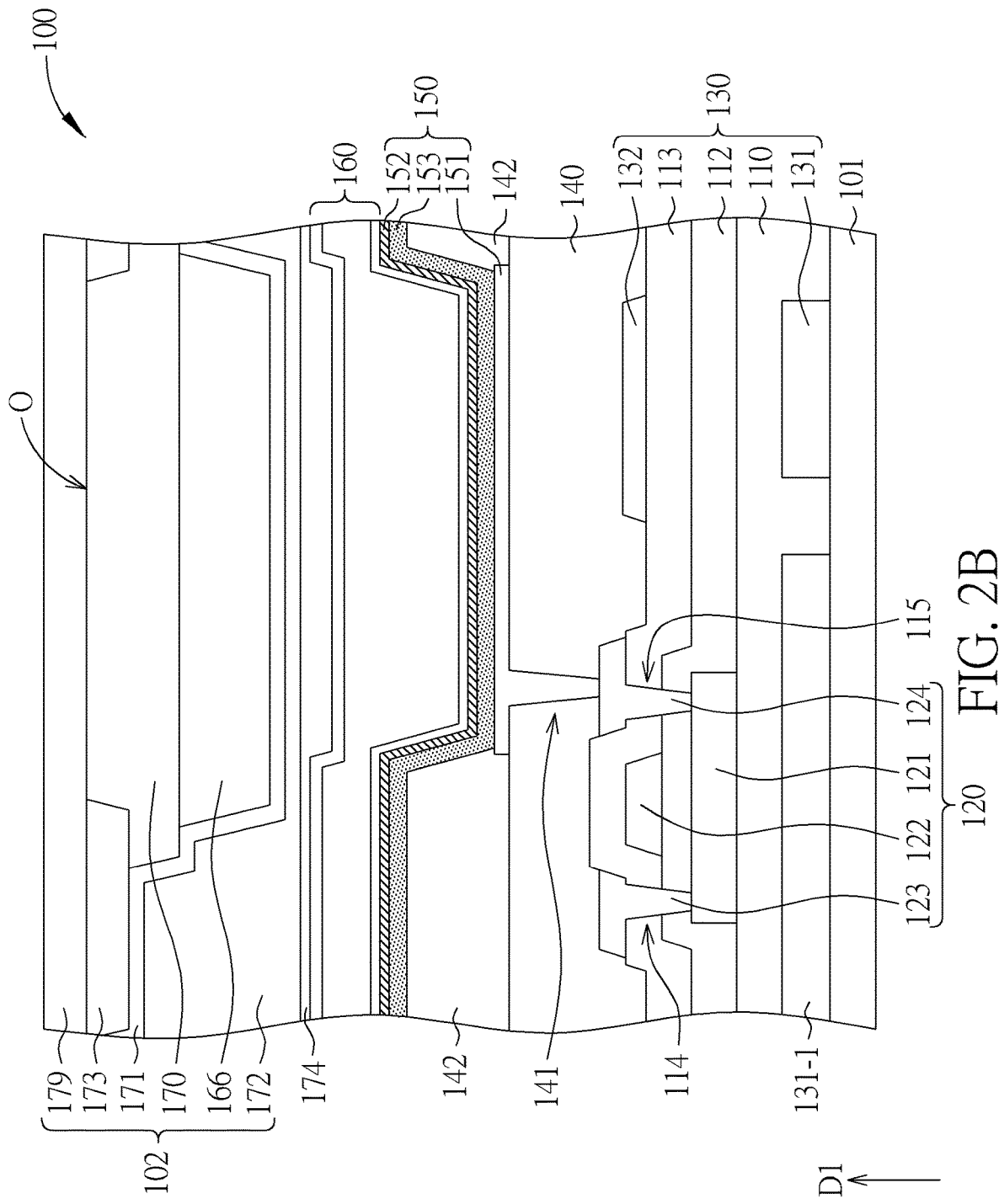

FIG. 2A and FIG. 2B are schematic diagrams of the cross-sectional structures of the display device 100 according to the second embodiment of the present disclosure. Compared with the first embodiment, the main difference between the second embodiment and the first embodiment resides in the different configuration of the stack structure including the storage capacitor 130. For example, the first electrode 131 of the storage capacitor 130 of the second embodiment may be disposed between the substrate 101 and the first inorganic layer 110. The first electrode 131 and the shielding metal layer 131-1 may be formed of the same conductive layer, but it is not limited thereto. The second electrode 132 of the storage capacitor 130 of the second embodiment may be disposed between the third inorganic layer 113 and the first organic layer 140, and the second electrode 132 and the source electrode 124 and/or the drain electrode 123 may be formed of the same conductive layer, but it is not limited thereto. It should be noted that it is not limited to this only although the second electrode 132 is illustrated to be disposed on the first electrode 131 in the embodiment. In other embodiments, the positions of the first electrode 131 and the second electrode 132 may be optionally interchanged. In other words, the second electrode 132 of the storage capacitor 130 may be disposed between the substrate 101 and the first inorganic layer 110, and the first electrode 131 of the storage capacitor 130 may be disposed between the third inorganic layer 113 and the first organic layer 140. In some embodiments, the first inorganic layer 110, the second inorganic layer 112, and/or the third inorganic layer 113 may be disposed between the first electrode 131 and the second electrode 132 to serve as the dielectric layer of the storage capacitor 130, but it is not limited thereto. In some embodiments, the shielding metal layer 131-1 may be used to block or shield the light coming from the bottom side of the substrate 101 to reduce the adverse effects of the backside light on the thin film transistor 120, or to reduce the damages of the elements of the display device 100 caused by static electricity, but it is not limited thereto.

The manufacturing process of the display device 100 of the second embodiment will be briefly described as follows, but it is not limited thereto. Please refer to FIG. 2A, a first conductive layer (not shown) may be disposed on the substrate 101, and the first conductive layer may be patterned to obtain the first electrode 131 and the shielding metal layer 131-1. In other words, the first electrode 131 and the shielding metal layer 131-1 may be formed of the same conductive layer. Next, the first inorganic layer 110 may be disposed on the first electrode 131 and the shielding metal layer 131-1, the first electrode 131 and the shielding metal layer 131-1 may be disposed between the substrate 101 and the first inorganic layer 110. Then, as described above, the thin film transistor 120, other layers of the storage capacitor 130 (such as the second electrode 132), the blue organic light emitting diode 150, the inorganic insulating layer and/or the organic insulating layer are completed on the substrate 101. In this embodiment, please refer to the above embodiments for the procedures and conditions of other material layers, and they will not be elaborated again. After the second substrate structure 102 (please refer to FIG. 1C) is aligned and attached to the substrate 101 of the second embodiment, the display device 100 of the second embodiment as shown in FIG. 2B may be obtained.

Figure 3:
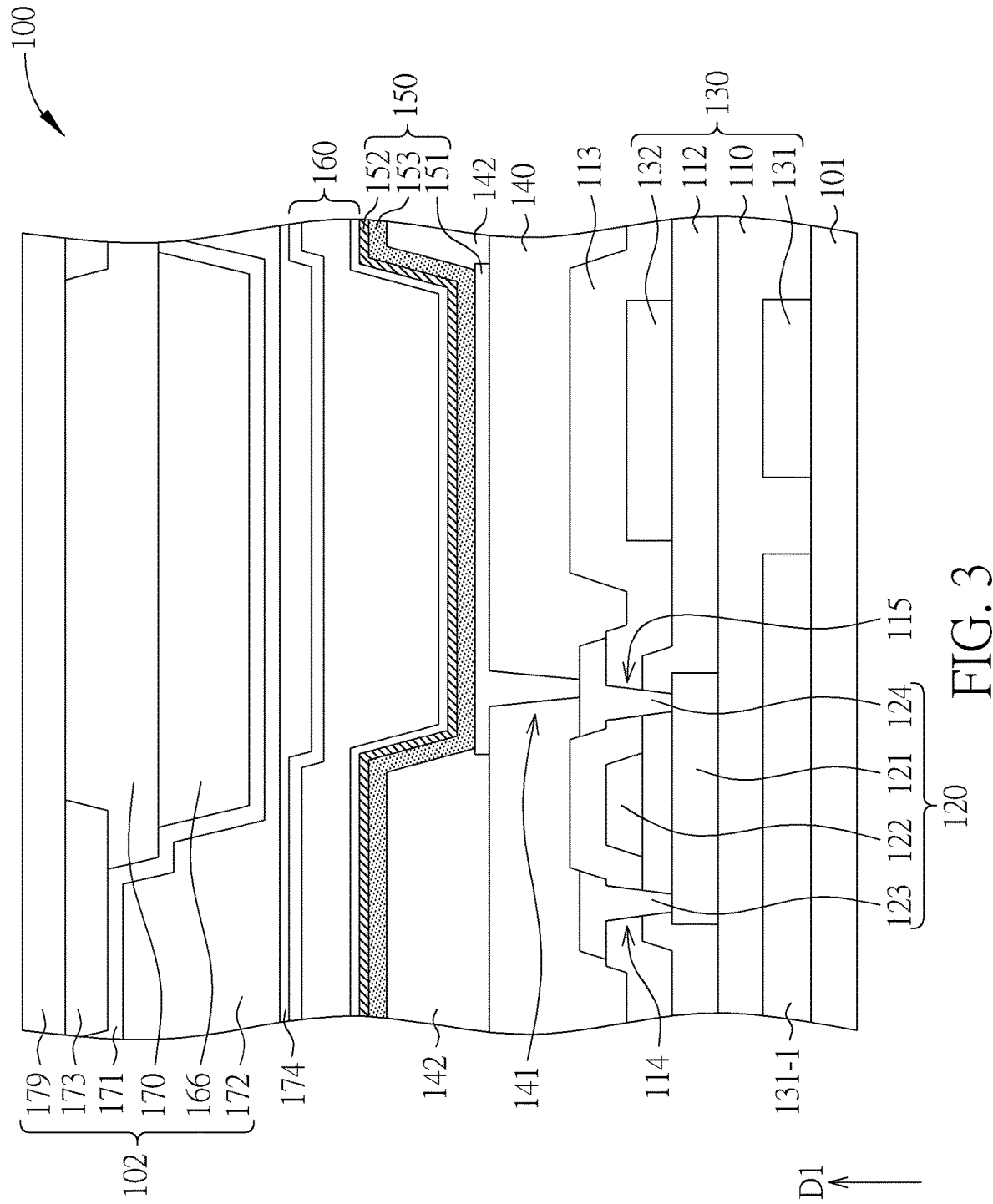
FIG. 3 is a schematic diagram of a cross-sectional structure of a display device according to a third embodiment of the present disclosure.

FIG. 3 is a schematic diagram of a cross-sectional structure of a display device 100 according to a third embodiment of the present disclosure. Compared with the first embodiment, the main difference between the third embodiment and the first embodiment resides in the different configuration of the stack structure of the storage capacitor 130, so similar structures will not be elaborated again. For example, the second electrode 132 may be disposed between the second inorganic layer 112 and the third inorganic layer 113. The second electrode 132 and the gate electrode 122 may be formed of the same conductive layer. In some embodiments, the first inorganic layer 110 and the second inorganic layer 112 may be disposed between the first electrode 131 and the second electrode 132 to serve as the dielectric layer of the storage capacitor 130. In some embodiments, the positions of the second electrode 132 and the first electrode 131 may be interchanged. In other words, the second electrode 132 of the storage capacitor 130 may be disposed between the substrate 101 and the first inorganic layer 110, and the first electrode 131 of the storage capacitor 130 may be disposed between the second inorganic layer 112 and the third inorganic layer 113.

The manufacturing process of the display device 100 of the third embodiment will be briefly described as follows, but it is not limited thereto. Please refer to FIG. 3, a conductive layer (not shown) may be disposed on the substrate 101, and the conductive layer may be patterned to obtain the first electrode 131 and the shielding metal layer 131-1. In other words, the first electrode 131 and the shielding metal layer 131-1 may be formed of the same conductive layer. Next, a first inorganic layer 110 may be disposed on the first electrode 131 and the shielding metal layer 131-1. The first electrode 131 and the shielding metal layer 131-1 may be disposed between the substrate 101 and the first inorganic layer 110. The first electrode 131 and the shielding metal layer 131-1 may be formed of the same conductive layer. Then, a metal oxide semiconductor 121 may be disposed on the first inorganic layer 110, and a second inorganic layer 112 and a conductive layer (not shown) may be respectively disposed on the first inorganic layer 110, the conductive layer may be patterned to obtain a second electrode 132 and the gate electrode 122, the second electrode 132 and the gate electrode 122 may be formed of the same conductive layer. Later, as described above, the thin film transistor 120, the blue organic light emitting diode 150, the inorganic insulating layer and/or the organic insulating layer are completed on the substrate 101. In this embodiment, please refer to the above embodiments for the procedures and conditions of other material layers, and they will not be elaborated again. After the second substrate structure 102 (please refer to FIG. 1C) is aligned and attached to the substrate 101 of the third embodiment, the display device 100 of the third embodiment as shown in FIG. 3 may be obtained.

Figure 4A:
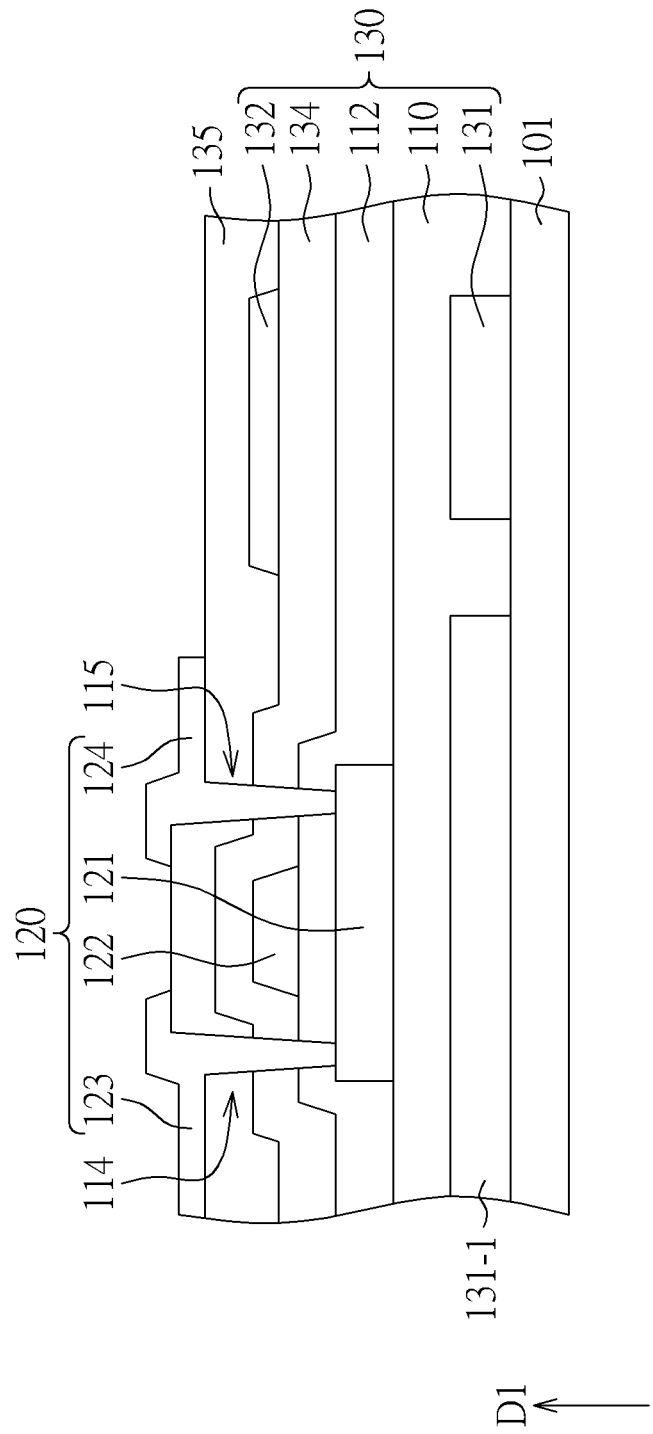
FIG. 4A and FIG. 4B are schematic diagrams of the cross-sectional structures of the display device in different manufacturing stages according to the fourth embodiment of the present disclosure.
Figure 4B:
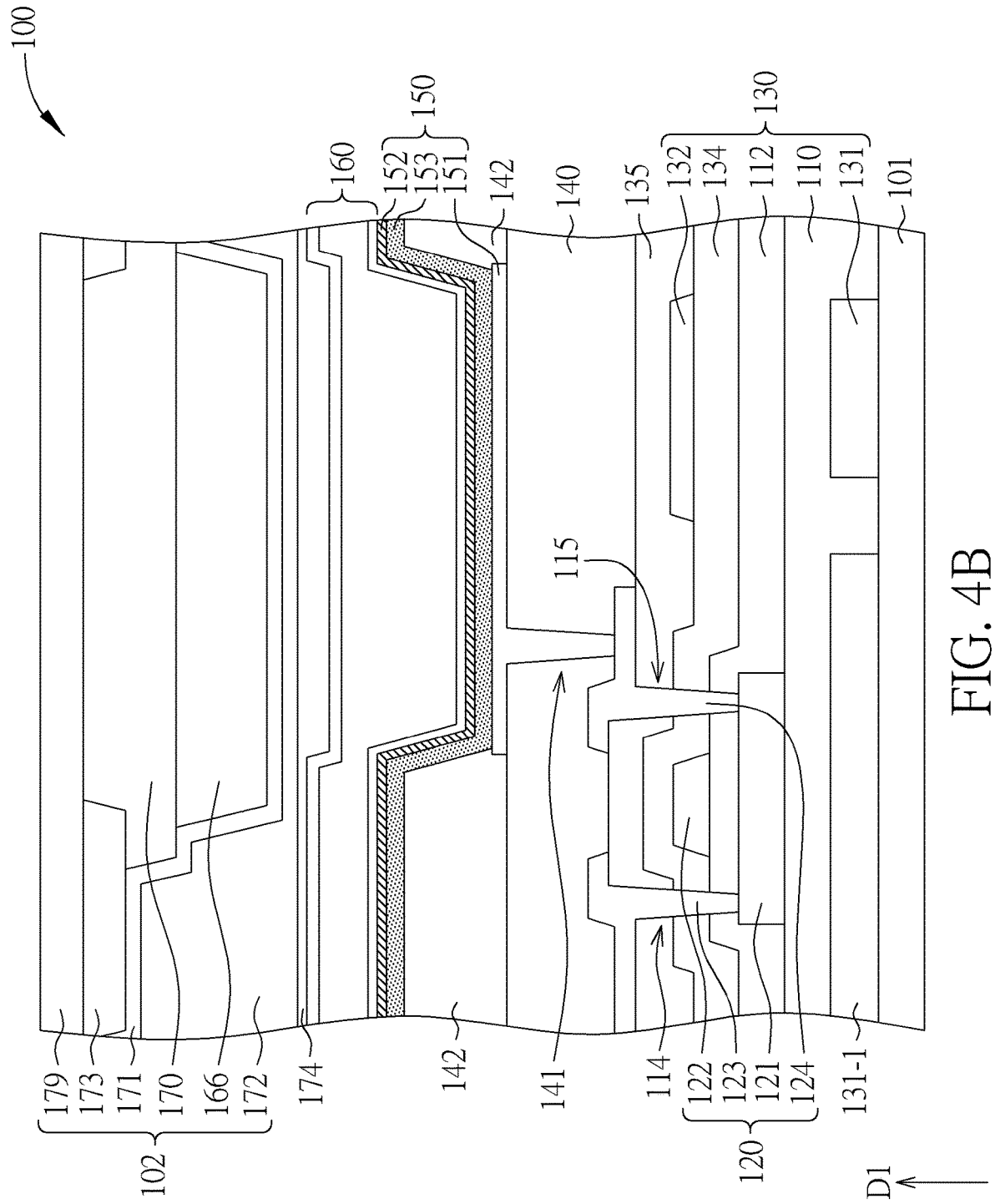

FIG. 4A and FIG. 4B are schematic diagrams of the cross-sectional structures of the display device 100 in different manufacturing stages according to the fourth embodiment of the present disclosure. Compared with the first embodiment, the main difference of the fourth embodiment resides in the inclusion of a fourth inorganic layer 134 and a fifth inorganic layer 135 in the fourth embodiment and in the different configuration of the stack structure of the storage capacitor 130, so similar structures will not be elaborated again. For example, in the fourth embodiment, the fourth inorganic layer 134 and the fifth inorganic layer 135 may be disposed between the gate electrode 122 and the first organic layer 140, and the second electrode 132 of the storage capacitor 130 may be selectively disposed between the fourth inorganic layer 134 and the fifth inorganic layer 135, and the first electrode 131 of the storage capacitor 130 may be disposed between the substrate 101 and the first inorganic layer 110. In the fourth embodiment, the first inorganic layer 110, the second inorganic layer 112 and/or the fourth inorganic layer 134 may be disposed between the first electrode 131 and the second electrode 132 to serve as the dielectric layer of the storage capacitor 130, but it is not limited thereto. The fourth inorganic layer 134 and the fifth inorganic layer 135 may be disposed between the gate electrode 122 and the source electrode 124/drain electrode 123. The materials of the fourth inorganic layer 134 and/or the fifth inorganic layer 135 may be similar to the materials of the first inorganic layer 110 or the second inorganic layer 112. In some embodiments, the positions of the second electrode 132 and the first electrode 131 may be interchanged. In other words, the first electrode 131 of the storage capacitor 130 may be disposed between the fourth inorganic layer 134 and the fifth inorganic layer 135, and the second electrode 131 of the storage capacitor 130 may be disposed between the substrate 101 and the first inorganic layer 110.

The manufacturing process of the display device 100 of the fourth embodiment will be briefly described as follows, but it is not limited thereto. Please refer to FIG. 4A, a conductive layer (not shown) may be provided on the substrate 101, and the conductive layer may be patterned to obtain the first electrode 131 and the shielding metal layer 131-1. Next, the first inorganic layer 110 may be disposed on the first electrode 131 and the shielding metal layer 131-1, the first electrode 131 and the shielding metal layer 131-1 may be disposed between the substrate 101 and the first inorganic layer 110. Then, a metal oxide semiconductor 121 may be disposed on the first inorganic layer 110, a second inorganic layer 112 and a conductive layer (not shown) may be respectively disposed on the first inorganic layer 110, and the conductive layer may be patterned to obtain a gate electrode 122. Later, a fourth inorganic layer 134 may be disposed on the second inorganic layer 112 and/or the gate electrode 122. Next, a conductive layer (not shown) may be disposed on the fourth inorganic layer 134, and the conductive layer may be patterned to obtain a second electrode 132. The second electrode 132 is not the same layer as other electrodes (such as the gate electrode 122, the source electrode 124 or the drain electrode 123), it may improve the design flexibility of the second electrode 132. For example, the design of the second electrode 132 may be adjusted to facilitate the adjustment of the capacitance value of the storage capacitor 130. Next, a fifth inorganic layer 135 may be disposed on the second electrode 132 and/or the fourth inorganic layer 134, and the fifth inorganic layer 135 may be patterned to obtain the first conductive via 114 and the second conductive via 115. The first conductive via 114 and the second conductive via 115 may penetrate the fifth inorganic layer 135, the fourth inorganic layer 134, and/or the second inorganic layer 112, but it is not limited thereto. Then, the source electrode 124 and the drain electrode 123 may be respectively filled in the first conductive via 114 and into the second conductive via 115 to complete the formation of the thin film transistor 120. In this embodiment, please refer to the above embodiments for the procedures and conditions of other material layers, and they will not be elaborated again. After the second substrate structure 102 (please refer to FIG. 1C) is aligned and attached to the substrate 101 of the fourth embodiment, the display device 100 of the fourth embodiment as shown in FIG. 4B may be obtained.

Figure 5:
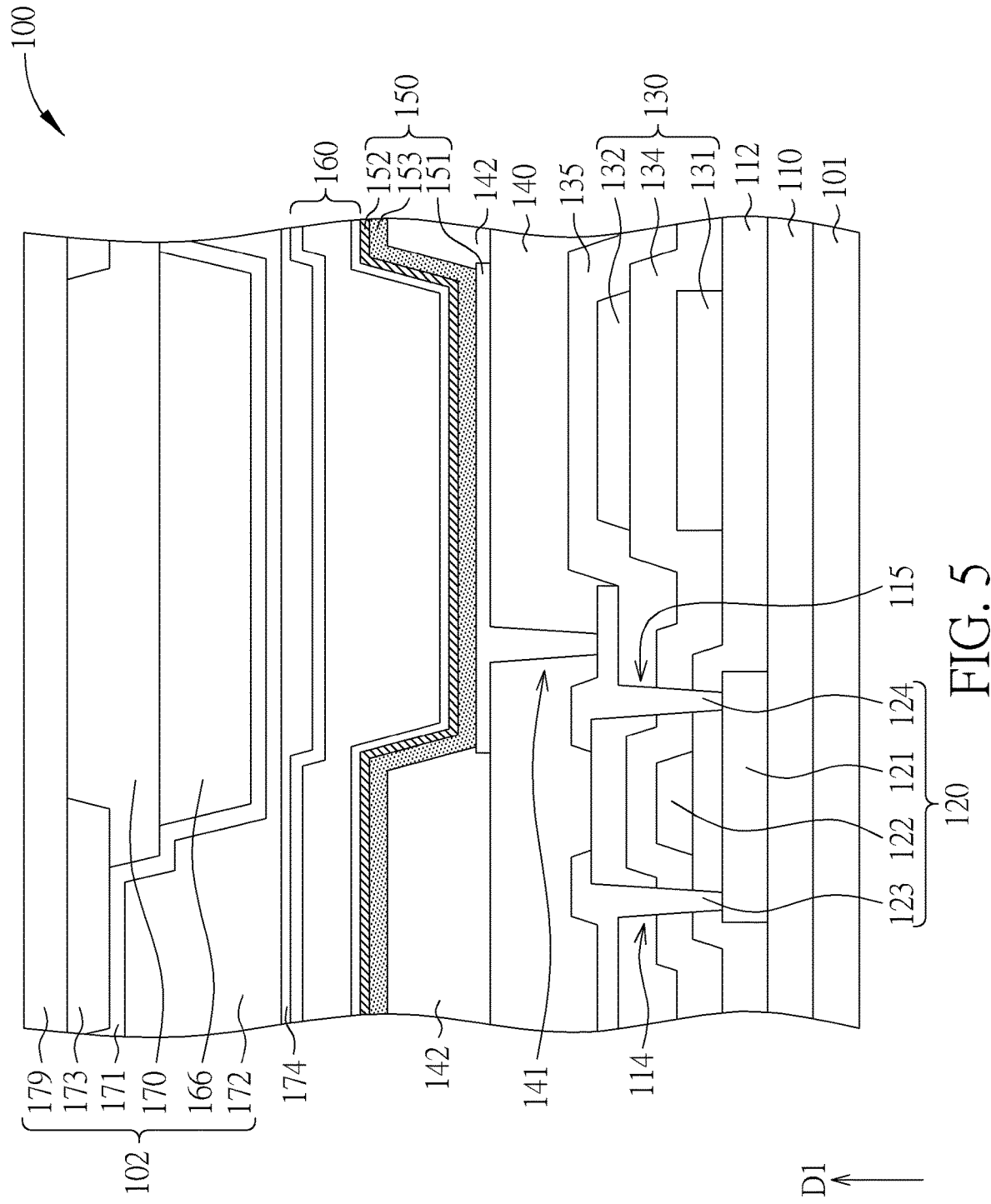
FIG. 5 is a schematic diagram of a cross-sectional structure of a display device according to a fifth embodiment of the present disclosure.

FIG. 5 is a schematic diagram of a cross-sectional structure of a display device 100 according to a fifth embodiment of the present disclosure. Compared with the fourth embodiment, the main difference of the fifth embodiment resides in the different configuration of the stack structure of the storage capacitor 130, so similar structures will not be elaborated again. For example, the first electrode 131 of the storage capacitor 130 of the fifth embodiment may be disposed between the second inorganic layer 112 and the fourth inorganic layer 134, and the second electrode 132 of the storage capacitor 130 may be disposed between the fourth inorganic layer 134 and the fifth inorganic layer 135. The first electrode 131 and the gate electrode 122 may be formed of the same conductive layer. This configuration may simplify the manufacturing process. The fourth inorganic layer 134 of the fifth embodiment may be disposed between the first electrode 131 and the second electrode 132 to serve as a dielectric layer of the storage capacitor 130, but it is not limited thereto. In some embodiments, the positions of the second electrode 132 and the first electrode 131 may be interchanged. In other words, the second electrode 132 may be disposed between the second inorganic layer 112 and the fourth inorganic layer 134, and the first electrode 131 of the storage capacitor 130 may be disposed between the fourth inorganic layer 134 and the fifth inorganic layer 135.

The manufacturing process of the display device 100 of the fifth embodiment will be briefly described as follows, but it is not limited thereto. Please refer to FIG. 5, a first inorganic layer 110 and a metal oxide semiconductor 121 are provided on the substrate 101. Next, a second inorganic layer 112 and a conductive layer (not shown) may be disposed on the first inorganic layer 110, and the conductive layer may be patterned to obtain the first electrode 131 and the gate electrode 122. Then, a fourth inorganic layer 134 may be disposed on the second inorganic layer 112, the first electrode 131 and the gate electrode 122. Later, a conductive layer (not shown) may be disposed on the fourth inorganic layer 134, and the conductive layer may be patterned to obtain the second electrode 132. Since the second electrode 132 is not formed together with other electrodes (such as the gate electrode 122, the source electrode 124 or the drain electrode 123), it may facilitate the design flexibility of the second electrode 132. Next, a fifth inorganic layer 135 may be disposed on the fourth inorganic layer 134, and the fifth inorganic layer 135 may be patterned to obtain the first conductive via 114 and/or the second conductive via 115. The first conductive via 114 and/or the second conductive via 115 may penetrate the fifth inorganic layer 135, the fourth inorganic layer 134 and/or the second inorganic layer 112, and then the source electrode 124 and the drain electrode 123 may be respectively disposed in the first conductive via 114 and the second conductive via 115 to complete the fabrication of the thin film transistor 120. In this embodiment, please refer to the above embodiments for the procedures and conditions of other material layers, and they will not be elaborated again. After the second substrate structure 102 (please refer to FIG. 1C) is aligned and attached to the substrate 101 of the fifth embodiment, the display device 100 of the fifth embodiment as shown in FIG. 5 may be obtained.

Figure 6:
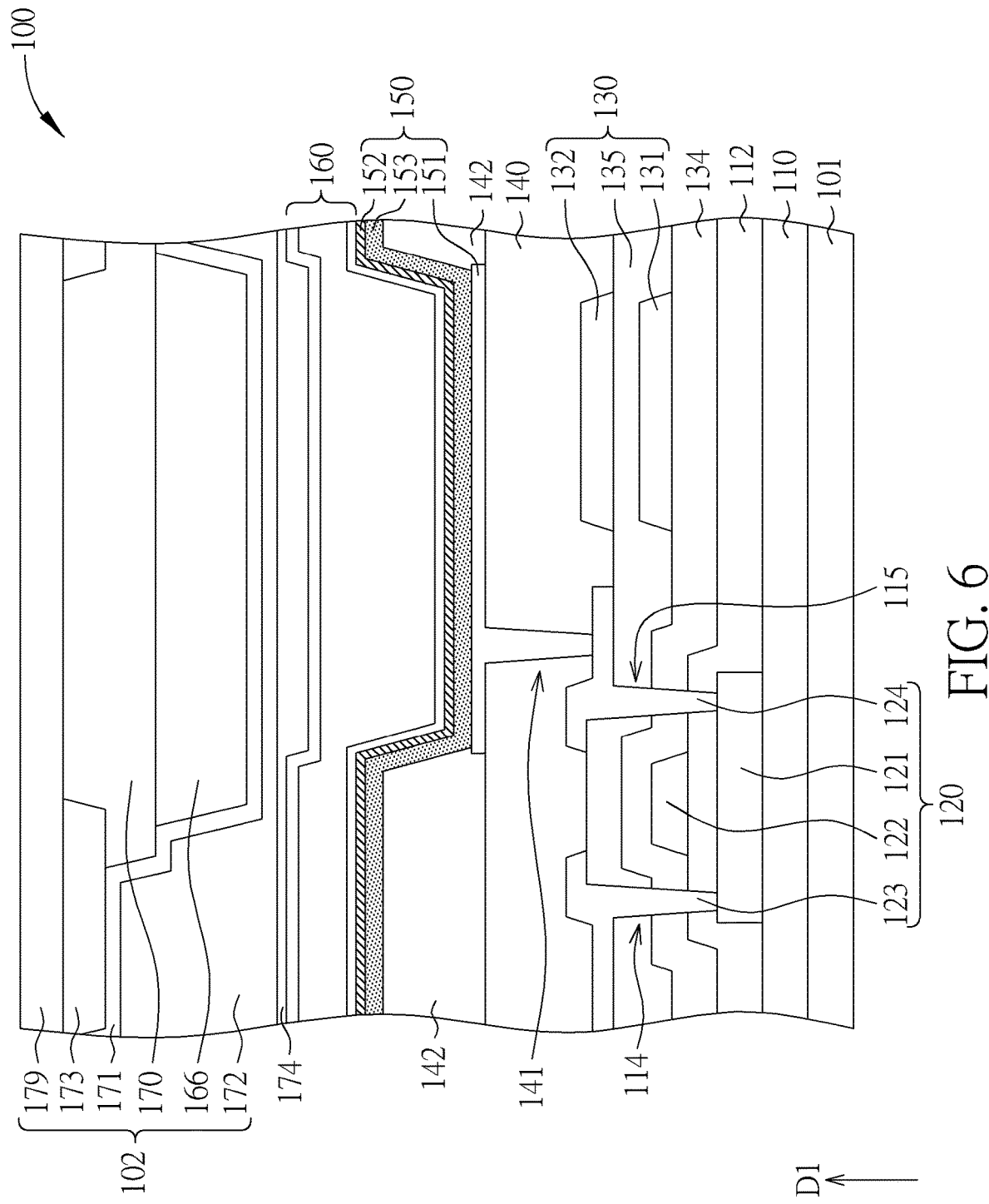
FIG. 6 is a schematic diagram of a cross-sectional structure of a display device according to a sixth embodiment of the present disclosure.

FIG. 6 is a schematic diagram of a cross-sectional structure of a display device 100 according to a sixth embodiment of the present disclosure. Compared with the first embodiment, the main difference of the sixth embodiment resides in the different configuration of the stack structure of the storage capacitor 130, so similar structures will not be elaborated again. For example, the first electrode 131 of the storage capacitor 130 of the sixth embodiment may be disposed between the fourth inorganic layer 134 and the fifth inorganic layer 135, and the second electrode 132 may be disposed between the fifth inorganic layer 135 and the first organic layer 140. The second electrode 132 may be formed of the same conductive layer as the source electrode 124 and the drain electrode 123, but it is not limited thereto. The fifth inorganic layer 135 may be disposed between the first electrode 131 and the second electrode to serve as a dielectric layer of the storage capacitor 130. In some embodiments, the positions of the first electrode 131 and the second electrode 132 may be interchanged. In other words, the second electrode 132 may be disposed between the fourth inorganic layer 134 and the fifth inorganic layer 135, and the first electrode 131 may be disposed between the fifth inorganic layer 135 and the first organic layer 140.

The manufacturing process of the display device 100 of the sixth embodiment will be briefly described as follows, but it is not limited thereto. First, please refer to the illustration in FIG. 6, a first inorganic layer 110, a metal oxide semiconductor 121 and a second inorganic layer 112 may be provided on the substrate 101. Next, a gate electrode 122 may be provided on the second inorganic layer 112. Later, a fourth inorganic layer 134 may be provided on the second inorganic layer 112 and the gate electrode 122. Then, a conductive layer (not shown) may be disposed on the fourth inorganic layer 134, and the conductive layer may be patterned to obtain the first electrode 131. Because the first electrode 131 disposed on the fourth inorganic layer 134 is not formed together with other electrodes (for example, the gate electrode 122, the source electrode 124 or the drain electrode 123), it may facilitate the design flexibility of the first electrode 131. Later, a fifth inorganic layer 135 may be provided on the fourth inorganic layer 134 and the first electrode 131. Next, the fifth inorganic layer 135 may be patterned to obtain a first conductive via 114 and/or a second conductive via 115. The first conductive via 114 and/or the second conductive via 115 may penetrate the fifth inorganic layer 135, the fourth inorganic layer 134 and/or the second inorganic layer 112. Then, a conductive layer may be disposed on the fifth inorganic layer 135, and then the conductive layer may be patterned to obtain the second electrode 132, the source electrode 124 and the drain electrode 123. The second electrode 132, the source electrode 124, and/or the drain electrode 123 may be formed of the same conductive layer. In this embodiment, please refer to the above embodiments for the procedures and conditions of other material layers, and they will not be elaborated again. After the second substrate structure 102 (please refer to FIG. 1C) is aligned and attached to the substrate 101 of the sixth embodiment, the display device 100 of the sixth embodiment as shown in FIG. 6 may be obtained.

The present disclosure further proposes an auxiliary electrode for use in the laminated structure of the above-mentioned display device to help reduce the problems of the display device of insufficient driving voltage or of IR drop. Various embodiments of the auxiliary electrode for used in the laminated structures of the display device are described as follows.

Please refer to FIG. 1B and FIG. 1C. An auxiliary electrode 155 may be optionally added to the first embodiment. As shown in FIG. 1B, the auxiliary electrode 155 may be disposed on the cathode 152. The cathode 152 may be electrically connected to the auxiliary electrode 155, and the auxiliary electrode 155 may selectively contact the cathode 152 directly or indirectly. The thickness of the auxiliary electrode 155 may be greater than the thickness of the cathode 152 to improve the problem of the IR drop caused by insufficient driving voltage of the display device 100. The above-mentioned comparison between the thickness of the auxiliary electrode 155 and the thickness of the cathode 152 may be measured in a cross-sectional image. For example, the thickness of the auxiliary electrode 155 may be obtained by measuring the maximum thickness of the auxiliary electrode 155 which overlaps the cathode 152 under the same cross-sectional image, the thickness of the cathode 152 may be obtained by measuring the maximum thickness of the cathode 152 which overlaps the auxiliary electrode 155. In some embodiments, the materials of the auxiliary electrode 155 may include a low electric resistance material. In some embodiments, the materials of the auxiliary electrode 155 may be made of a material including copper, aluminum, silver or an alloy, but it is not limited thereto. In some embodiments, the materials of the auxiliary electrode 155 may include nanosilver, nanosilver paste, conductive carbon material, other suitable materials or a combination thereof, but it is not limited thereto. The auxiliary electrode 155 may be formed by etching or transferring the conductive layer, but it is not limited thereto. In some embodiments (as shown in FIG. 1B), the auxiliary electrode 155 may overlap the thin film transistor 120 and/or the second organic layer 142 in the top view direction D1. In some embodiments (as shown in FIG. 1B), the auxiliary electrode 155 may be disposed on the second organic layer 142. In some embodiments, in the top view direction D1, the auxiliary electrode 155 may not overlap the blue organic light emitting diode 150 and/or the storage capacitor 130 to reduce the shielding of the light coming from the blue organic light emitting diode 150 caused by the auxiliary electrode 155, or to make the auxiliary electrode 155 less likely interfere with the storage capacitor 130.

Figure 7:
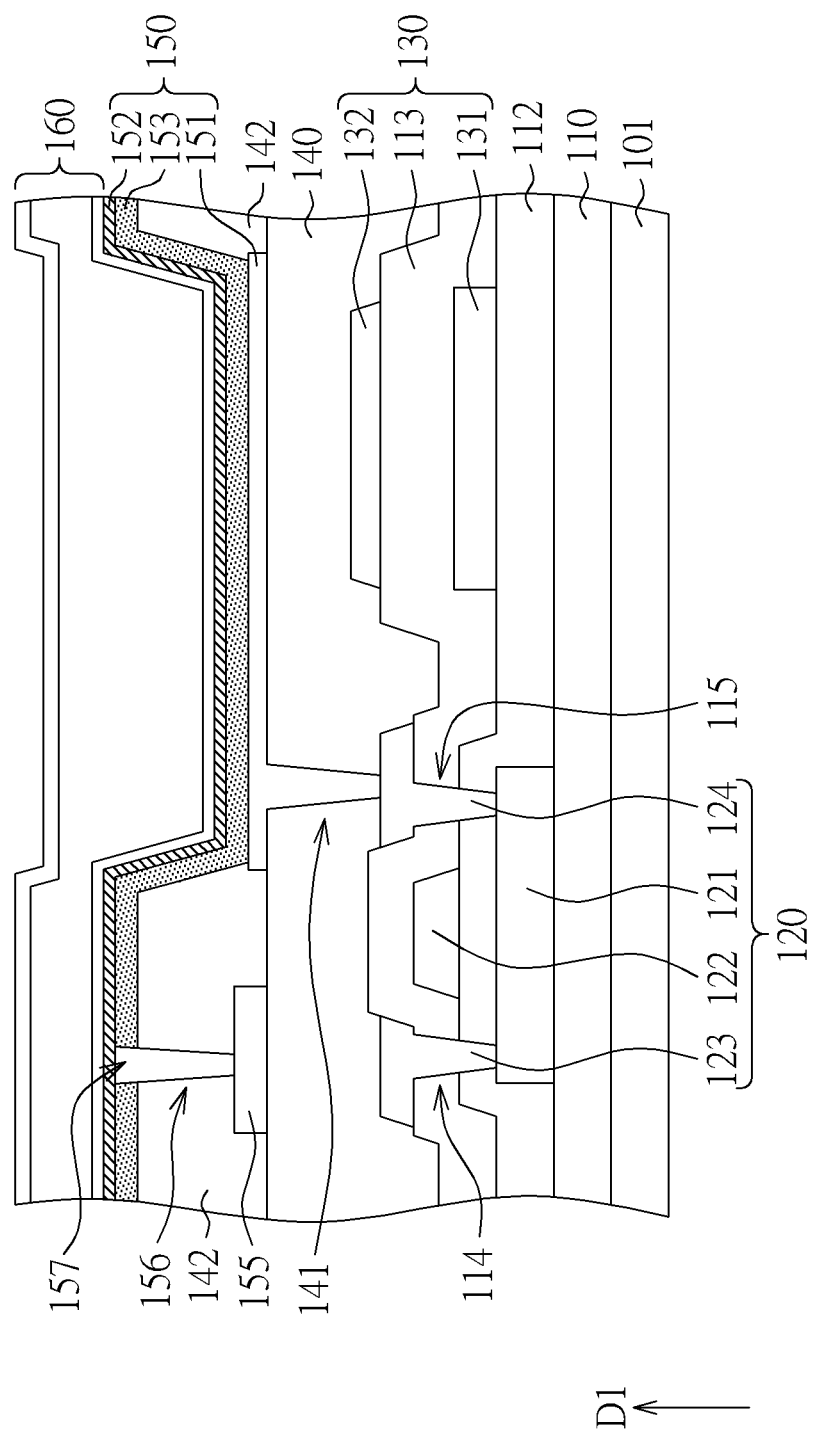
FIG. 7 is a schematic diagram of the cross-sectional structure of the display device in the manufacturing stages according to the seventh embodiment of the present disclosure.

FIG. 7 is a schematic diagram of the cross-sectional structure of the display device 100 in the manufacturing stages according to the seventh embodiment of the present disclosure. Compared with the first embodiment (please refer to FIG. 1B and FIG. 1C), the main difference of the seventh embodiment resides in the different position of the auxiliary electrode 155. As shown in FIG. 7, the second organic layer 142 may be disposed between the blue organic light emitting layer 150 and the first organic layer 140, and the auxiliary electrode 155 may be disposed between the second organic layer 142 and the first organic layer 140. Specifically speaking, please refer to the descriptions of the above first embodiment, the first organic layer 140 may be provided and the first organic layer 140 may be patterned to form the contact via 141. Next, a conductive layer (not shown) may be disposed on the first organic layer 140, and the conductive layer may be selectively filled in the contact via 141, and then the conductive layer may be patterned to obtain the anode 151 of the blue organic light emitting diode 150 and/or the auxiliary electrode 155. The auxiliary electrode 155 and/or the anode 151 may be disposed on the first organic layer 140 and located between the second organic layer 142 and the first organic layer 140. In other words, the anode 151 and the auxiliary electrode 155 may be formed of the same conductive layer, and this configuration may be beneficial to simplify the manufacturing process. Then, the second organic layer 142 and the blue organic light emitting layer 153 may be formed, the second organic layer 142 may be disposed between the blue organic light emitting layer 153 and the first organic layer 140. The second organic layer 142 may be used as a pixel defining layer or a planarization layer. Later, an auxiliary electrode via 156 which penetrates the blue organic light emitting layer 153 and/or the second organic layer 142 is formed, the auxiliary electrode via 156 may expose a portion of the auxiliary electrode 155. In some embodiments, the auxiliary electrode via 156 may be formed by laser drilling, etching or other methods, but it is not limited thereto. Afterwards, the cathode 152 of the blue organic light emitting diode 150 may be formed. A portion of the cathode 152 may selectively fill in the auxiliary electrode via 156, the cathode 152 may be electrically connected to the auxiliary electrode 155 through the auxiliary electrode via 156, but it is not limited thereto. In some embodiments, the conductive material 157 in the auxiliary electrode via 156 may be the same as or different from the cathode 152. In other embodiments, a conductive material 157 may fill in the auxiliary electrode via 156, the cathode 152 may be electrically connected to the auxiliary electrode 155 through the conductive material 157. The materials of the cathode 152 and/or the conductive material 157 may include a transparent conductive material, silver paste, electric conductive glue, other suitable materials or a combination thereof, but it is not limited thereto.

In some embodiments, the auxiliary electrode 155 may overlap the thin film transistor 120 or the second organic layer 142 in the top view direction D1. In some embodiments, in the top view direction D1, the auxiliary electrode 155 may not overlap the blue organic light emitting diode 150 or the storage capacitor 130 with the advantages as described above. In this embodiment, please refer to the above embodiments for the procedures and conditions of other material layers, and they will not be elaborated again. After the second substrate structure 102 (refer to FIG. 1C) is aligned and attached to the substrate 101 of the seventh embodiment, the display device 100 of the seventh embodiment shown in FIG. 7 may be obtained.

Figure 8:
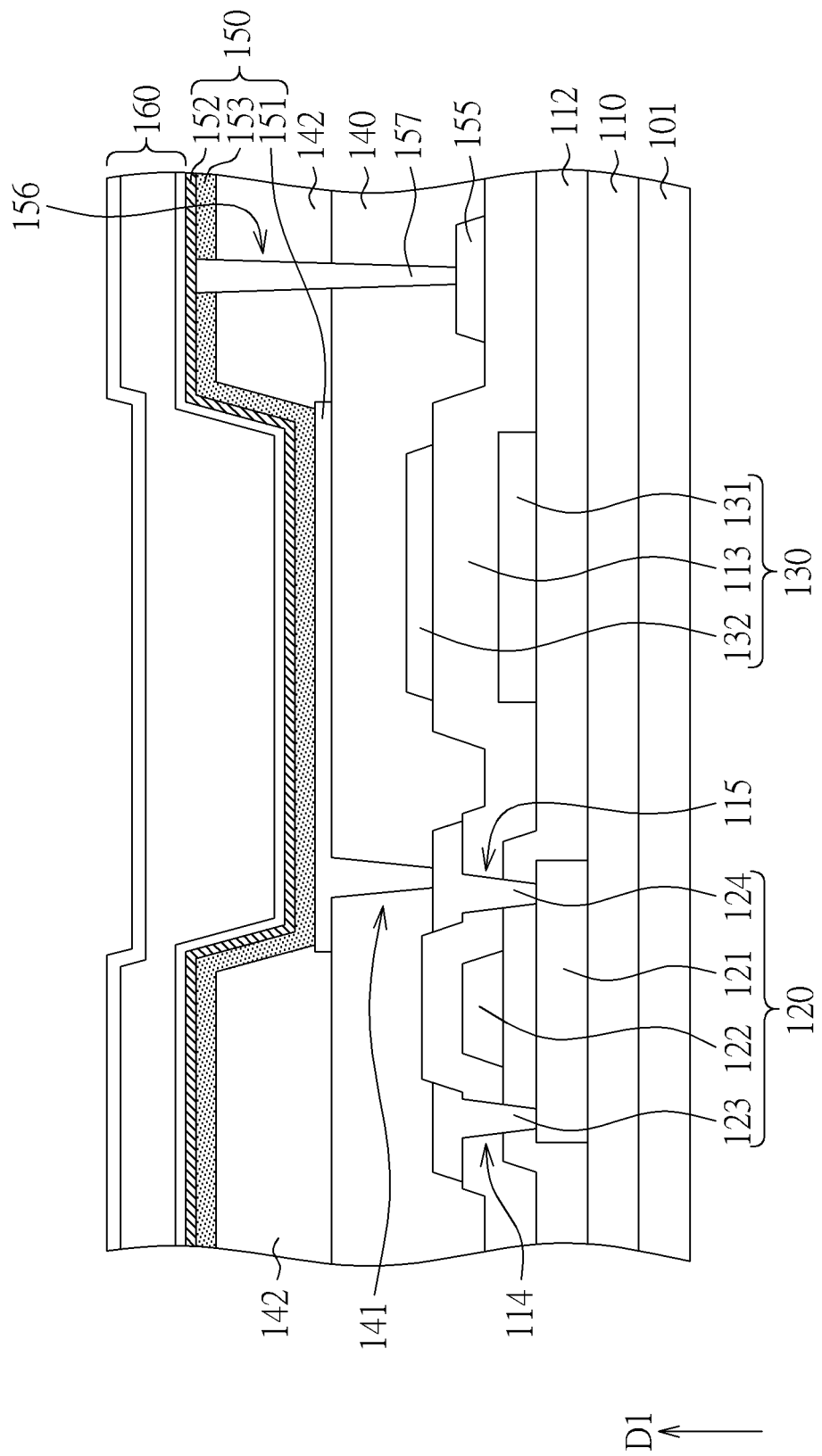
FIG. 8 is a schematic diagram of a cross-sectional structure of the display device in the manufacturing stages according to the eighth embodiment of the present disclosure.

FIG. 8 is a schematic diagram of a cross-sectional structure of the display device 100 in the manufacturing stages according to the eighth embodiment of the present disclosure. Compared with the first embodiment (please refer to FIG. 1B and FIG. 1C), the main difference of the eighth embodiment resides in the different position of the auxiliary electrode 155. As shown in FIG. 8, the second inorganic layer 112 may be disposed between the gate electrode 122 and the metal oxide semiconductor 121, the third inorganic layer 113 may be disposed between the first organic layer 140 and the second inorganic layer 112, and the auxiliary electrode 155 may be disposed between the third inorganic layer 113 and the first organic layer 140. Specifically speaking, please refer to the descriptions of the above first embodiment, a conductive layer (not shown) may be provided on the third inorganic layer 113, and the conductive layer (not shown) may be patterned to respectively obtain the auxiliary electrode 155, the second electrode 132, the source electrode 124 and/or the drain electrode 123. In other words, the auxiliary electrode 155, the second electrode 132, the source electrode 124 and/or the drain electrode 123 may be formed of the same conductive layer. This configuration is beneficial to simplify the manufacturing process. In addition, as shown in FIG. 8, the layers which the auxiliary electrode via 156 penetrates may be different when the auxiliary electrode 155, the second electrode 132, the source electrode 124 and/or the drain electrode 123 may be formed of the same conductive layer. For example in this embodiment, the auxiliary electrode via 156 may penetrate the blue organic light emitting layer 153, the second organic layer 142, and the first organic layer 140, the auxiliary electrode via 156 may expose a portion of the auxiliary electrode 155. In some embodiments, a conductive material 157 may fill in the auxiliary electrode via 156, the cathode 152 may be electrically connected to the auxiliary electrode 155 by the conductive material 157. In some embodiments, the conductive material 157 in the auxiliary electrode via 156 may be the same as or different from that of the cathode 152. In this embodiment, please refer to the above embodiments for the procedures and conditions of other material layers, and they will not be elaborated again. After the second substrate structure 102 (please refer to FIG. 1C) is aligned and attached to the substrate 101 of the eighth embodiment, the display device 100 of the eighth embodiment as shown in FIG. 8 may be obtained.

Figure 9:
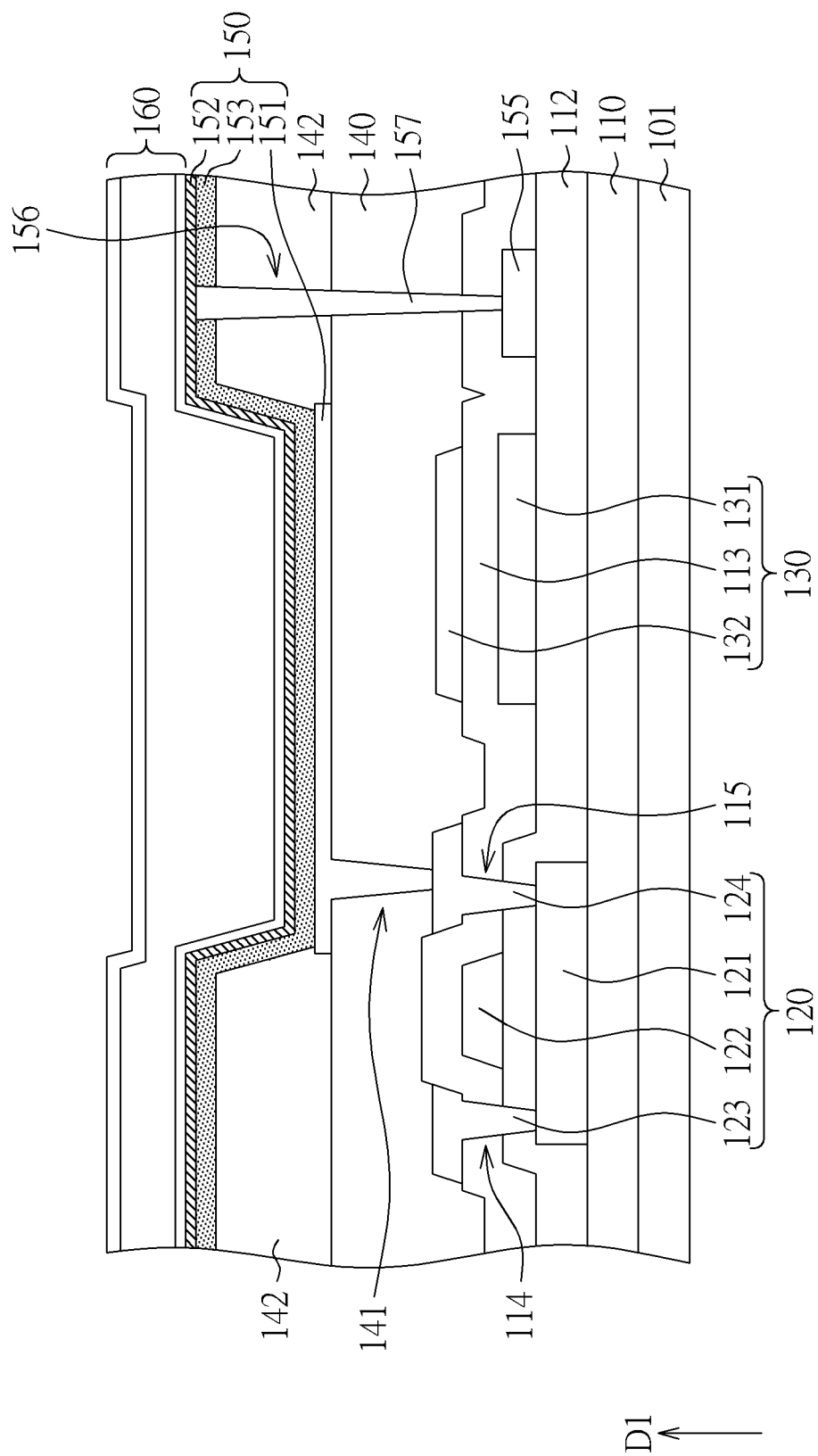
FIG. 9 is a schematic diagram of the cross-sectional structure of the display device in the manufacturing stages according to the ninth embodiment of the present disclosure.

FIG. 9 is a schematic diagram of the cross-sectional structure of the display device 100 in the manufacturing stages according to the ninth embodiment of the present disclosure. Compared with the first embodiment (please refer to FIG. 1B and FIG. 1C), the main difference of the ninth embodiment resides in the different position of the auxiliary electrode 155. As shown in FIG. 9, the auxiliary electrode 155 may be disposed between the second inorganic layer 112 and the third inorganic layer 113. Specifically speaking, please refer to the descriptions of the above first embodiment, a first conductive layer (not shown) is provided on the second inorganic layer 112, and the first conductive layer is patterned to respectively obtain the auxiliary electrode 155, the first electrode 131 and/or the gate electrode 122. In other words, the auxiliary electrode 155, the first electrode 131 and/or the gate electrode 122 may be formed of the same conductive layer, and this configuration may be beneficial to simplify the manufacturing process. In addition, as shown in FIG. 9, the layers which the auxiliary electrode via 156 penetrates may be different when the auxiliary electrode 155, the first electrode 131 and/or the gate electrode 122 are formed of the same conductive layer. For example in this embodiment, the auxiliary electrode via 156 may penetrate the blue organic light emitting layer 153, the second organic layer 142, the first organic layer 140 and/or the third inorganic layer 113, the auxiliary electrode via 156 may expose a portion of the auxiliary electrode 155. In some embodiments, a conductive material 157 may fill in the auxiliary electrode via 156, the cathode 152 may be electrically connected to the auxiliary electrode 155 by the conductive material 157. In some embodiments, the conductive material 157 filled in the auxiliary electrode via 156 may be the same as or different from that of the cathode 152. In this embodiment, please refer to the above embodiments for the procedures and conditions of other material layers, and they will not be elaborated again. After the second substrate structure 102 (please refer to FIG. 1C) is aligned and attached to the substrate 101 of the ninth embodiment, the display device 100 of the ninth embodiment as shown in FIG. 9 may be obtained.

Figure 10:
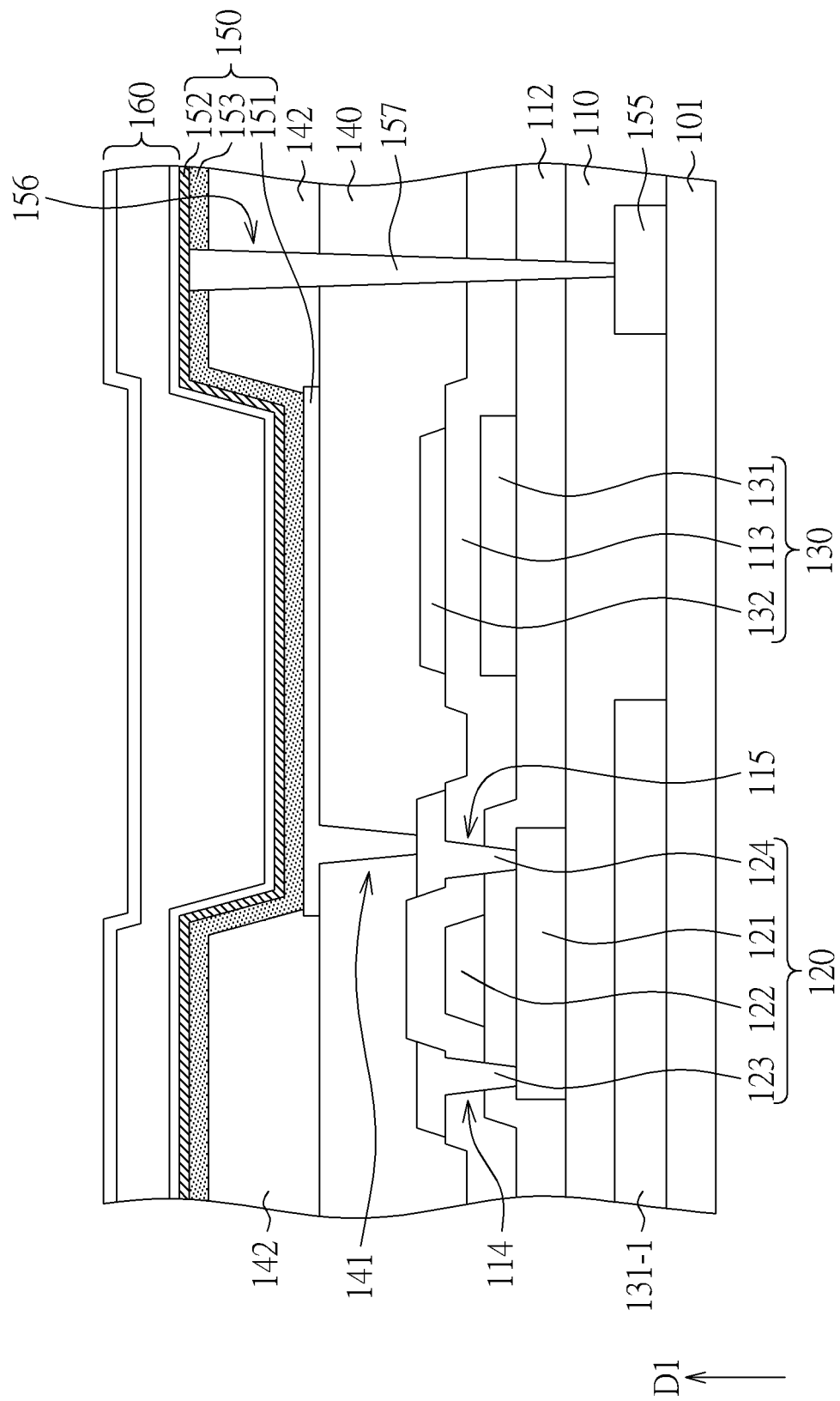
FIG. 10 is a schematic diagram of the cross-sectional structure of the display device in the manufacturing stages according to the tenth embodiment of the present disclosure.

FIG. 10 is a schematic diagram of the cross-sectional structure of the display device 100 in the manufacturing stages according to the tenth embodiment of the present disclosure. Compared with the first embodiment (please refer to FIG. 1B and FIG. 1C), the main difference of the tenth embodiment resides in the different position of the auxiliary electrode 155. As shown in FIG. 10, the auxiliary electrode 155 may be disposed between the substrate 101 and the first inorganic layer 140. Specifically speaking, please refer to the descriptions of the above first embodiment, a conductive layer (not shown) may be provided on the substrate 101, and the conductive layer may be patterned to respectively obtain the auxiliary electrode 155 and/or the shielding metal layer 131-1. In other words, the auxiliary electrode 155 and/or the shielding metal layer 131-1 may be formed of the same conductive layer, and this configuration may be beneficial to simplify the manufacturing process. In some embodiments, the shielding metal layer 131-1 may be used to help block or shield light coming from the bottom side of the substrate 101, or to reduce the effects of the backside light on the thin film transistor 120, or to reduce the damages of the elements of the display device 100 caused by static electricity. In some embodiments (not shown), the shielding metal layer 131-1 and the auxiliary electrode 155 may be selectively connected to or separated from each other. In addition, as shown in FIG. 10, the layers which the auxiliary electrode via 156 penetrates may be different when the auxiliary electrode 155 and the shielding metal layer 131-1 are formed of the same conductive layer. For example, the auxiliary electrode via 156 may penetrate the blue organic light emitting layer 153, the second organic layer 142, the first organic layer 140, the third inorganic layer 113, the second inorganic layer 112 and/or the first inorganic layer 110, the auxiliary electrode via 156 may expose a portion of the auxiliary electrode 155. In some embodiments, the conductive material 157 filled in the auxiliary electrode via 156 may be the same as or different from the cathode 152. In other embodiments (not shown), a conductive material 157 may fill in the auxiliary electrode via 156, the cathode 152 may be electrically connected to the auxiliary electrode 155 by the conductive material 157. In this embodiment, please refer to the above embodiments for the procedures and conditions of other material layers, and they will not be elaborated again. After the second substrate structure 102 (please refer to FIG. 1C) is aligned and attached to the substrate 101 of the tenth embodiment, the display device 100 of the tenth embodiment as shown in FIG. 10 may be obtained.

Figure 11:
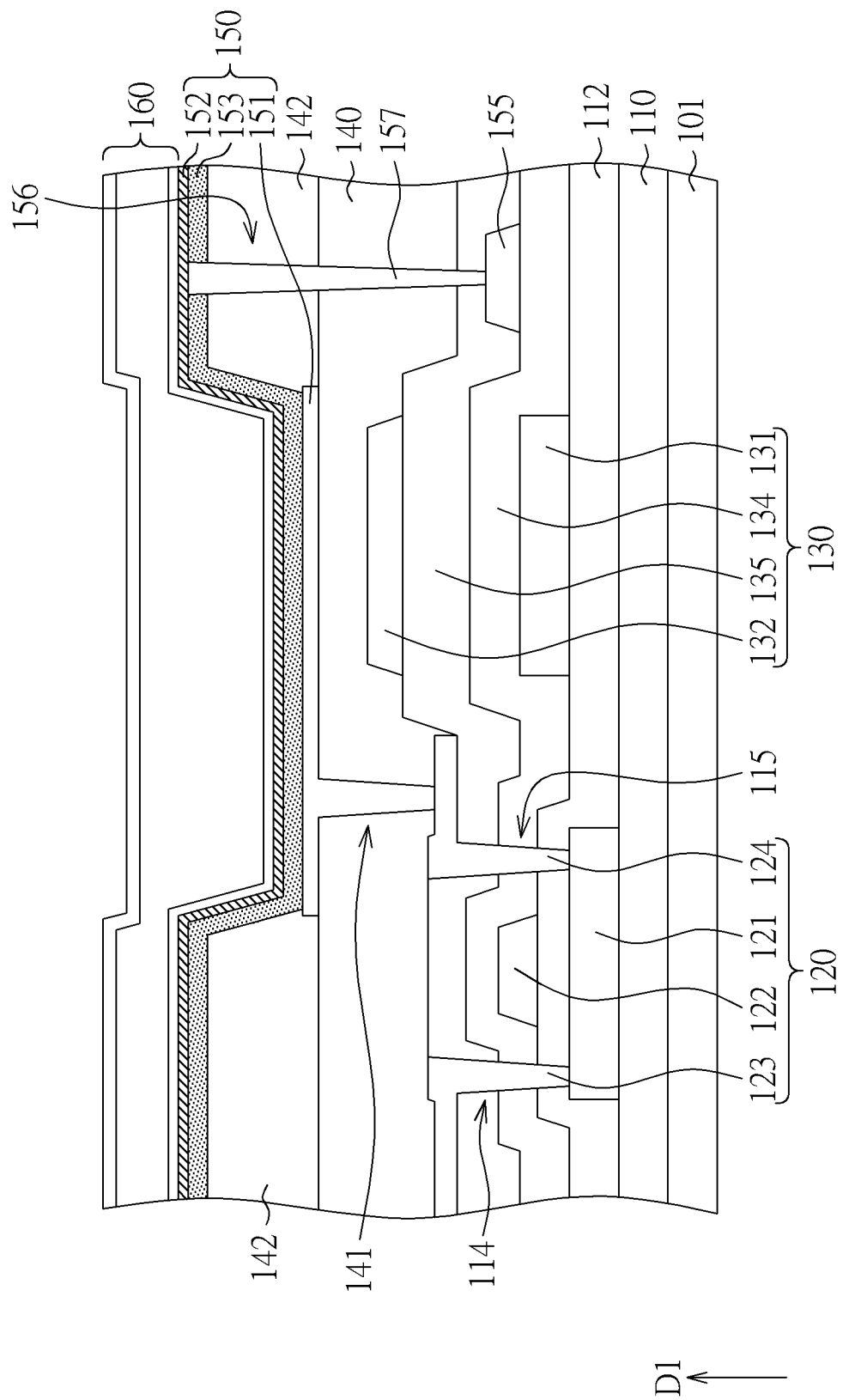
FIG. 11 is a schematic diagram of the cross-sectional structure of the display device in the manufacturing stages according to the eleventh embodiment of the present disclosure.

FIG. 11 is a schematic diagram of the cross-sectional structure of the display device 100 in the manufacturing stages according to the eleventh embodiment of the present disclosure. Compared with the first embodiment (please refer to FIG. 1B and FIG. 1C), the main difference of the eleventh embodiment resides in the different position of the auxiliary electrode 155. As shown in FIG. 11, the fourth inorganic layer 134 and the fifth inorganic layer 135 may be disposed between the gate electrode 122 and the first organic layer 140, the auxiliary electrode 155 may be disposed between the fourth inorganic layer 134 and the fifth inorganic layer 135. The auxiliary electrode 155 arranged between the fourth inorganic layer 134 and the fifth inorganic layer 135 may be not disposed together with other electrodes (such as the gate electrode 122, the source electrode 124 or the drain electrode 123) to facilitate the design flexibility of the auxiliary electrode 155. In addition, as shown in FIG. 11, the layers which the auxiliary electrode via 156 penetrates may be different when the auxiliary electrode 155 is disposed between the fourth inorganic layer 134 and the fifth inorganic layer 135. For example, the auxiliary electrode via 156 may penetrate the blue organic light emitting layer 153, the second organic layer 142, the first organic layer 140 and/or the fifth inorganic layer 135, the auxiliary electrode via 156 may expose a portion of the auxiliary electrode 155. In some embodiments, the conductive material 157 filled in the auxiliary electrode via 156 may be the same as or different from the cathode 152. In other embodiments (not shown), a conductive material 157 may fill in the auxiliary electrode via 156, the cathode 152 may be electrically connected to the auxiliary electrode 155 by the conductive material 157. In this embodiment, please refer to the above embodiments for the procedures and conditions of other material layers, and they will not be elaborated again. After the second substrate structure 102 (please refer to FIG. 1C) is aligned and attached to the substrate 101 of the eleventh embodiment, the display device 100 of the eleventh embodiment shown in FIG. 11 may be obtained. In this embodiment, the second electrode 132 of the storage capacitor 130 may be disposed on the fifth inorganic layer 135, and the fourth inorganic layer 134 and/or the fifth inorganic layer 135 may be disposed between the second electrode 132 and the first electrode 131 to serve as the dielectric layer of the storage capacitor 130, but it is not limited thereto.

It should be noted that the above-mentioned auxiliary electrode via 156 may be formed in a continuous or segmented manner. When the auxiliary electrode via 156 is formed in a segmented manner, it may be formed by multiple laser or etching steps, for example. In other words, the auxiliary electrode via 156 may be formed in a collection of multiple segmented via holes (not shown). Similarly, the conductive material 157 filled in the auxiliary electrode via 156 may also be filled in a continuous or segmented manner. It should be noted that, in the top view direction D1 (that is, the normal direction of the substrate 101), the auxiliary electrode in the above embodiments may not overlap the storage capacitor 130 and/or the thin film transistor 120. In this configuration, the interference between the storage capacitor 130 and the auxiliary electrode 155 may be reduced to less likely affect the function of the storage capacitor. In some embodiments, the first electrode 131 is electrically connected to the gate electrode of the thin film transistor, and the second electrode 132 may be electrically connected to the source electrode, but it is not limited thereto. In other embodiments, the first electrode 131 may be electrically connected to the gate electrode of the thin film transistor, and the second electrode 132 may be electrically connected to the drain electrode. Please refer to the descriptions of FIG. 13A later. It should be noted that the positions of the second electrode 132 and the first electrode 131 of the storage capacitor 130 in the above embodiments may be optionally interchanged.

Figure 12:
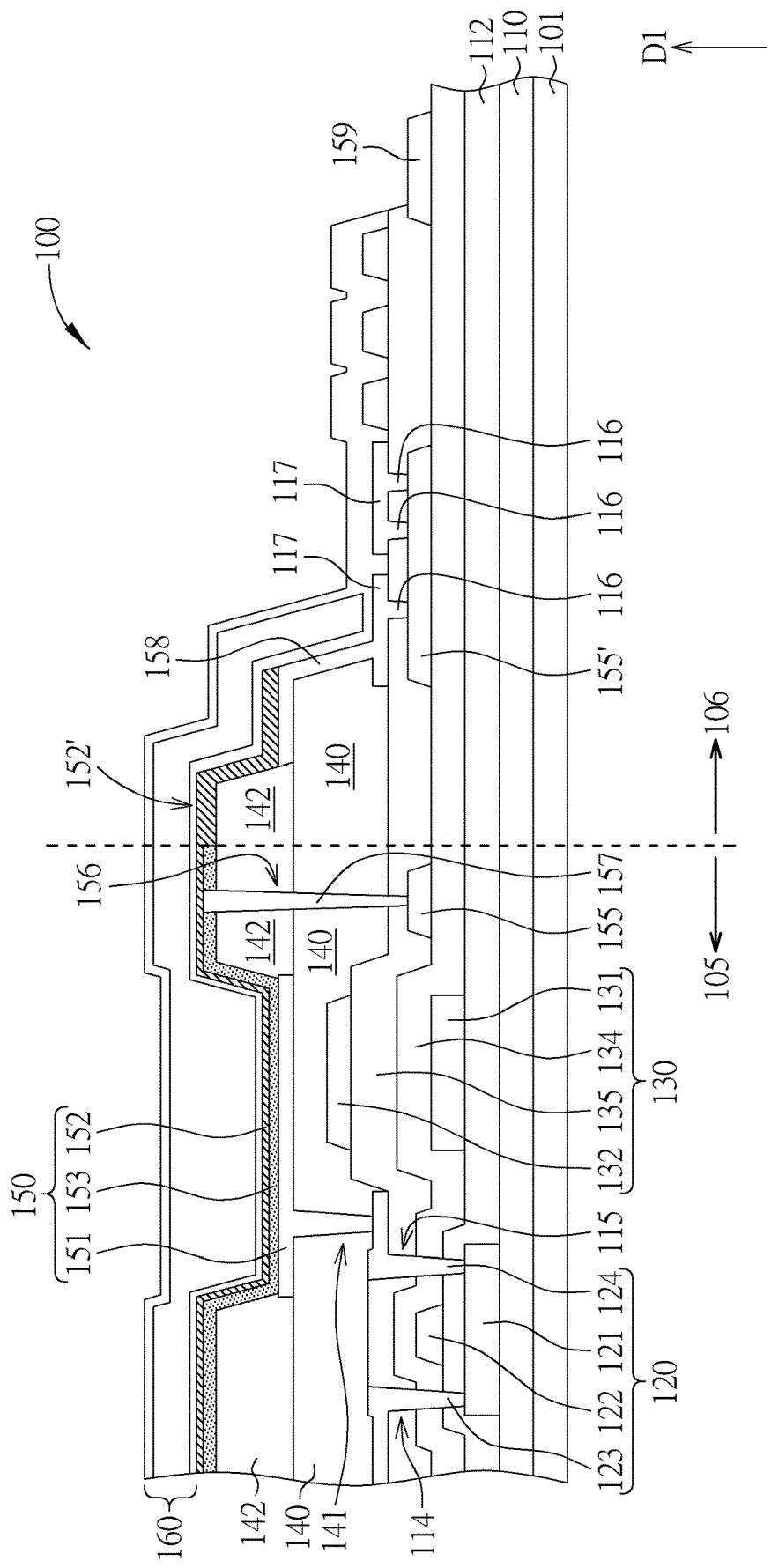
FIG. 12 is a schematic diagram of the cross-sectional structure of the display device including a display area and a non-display area according to a twelfth embodiment of the present disclosure.

Please continue to refer to FIG. 12. FIG. 12 is a schematic diagram of the cross-sectional structure of the display device 100 including a display area and a non-display area according to a twelfth embodiment of the present disclosure. As shown in FIG. 12, the display device 100 may include an auxiliary electrode 155 disposed in the display area 105 and/or an auxiliary electrode 155' disposed in the non-display area 106. The auxiliary electrode 155 may be electrically connected to the auxiliary electrode 155', but it is not limited thereto. In some embodiments, the non-display area 106 may be adjacent to the display area 105, there may be an external conductive pad provided in the non-display area 106 for the connection to an external circuit. In some embodiments, the display area 105 may be defined by the area which surrounds all blue organic light emitting layer 153, but it is not limited thereto.

In some embodiments, the auxiliary electrode 155 and the auxiliary electrode 155' may be selectively electrically connected with each other via some conductive layers, conductive pads and/or via holes. For example, the auxiliary electrode 155 is connected with the auxiliary electrode 155' via the conductive material 157 filled in the auxiliary electrode via 156, a portion of the cathode 152, the conductive portion 152' (for example, other portions of the same conductive layer as the cathode 152), the connecting portion 158, the conductive portion 117 (such as other parts of the same conductive layer as the anode 151), other conductive layers and/or via holes, but it is not limited thereto, thereby increasing the conductive paths of the cathode 152, the auxiliary electrode 155 and the auxiliary electrode 155' to reduce the electric resistance of the cathode 152 or to improve the problem of the IR drop caused by insufficient driving voltage. In some embodiments, the auxiliary electrode 155 may be electrically connected to the conductive pad 159 via the auxiliary electrode 155'. The conductive pad 159 may be used to connect a circuit board (not shown) or a chip (not shown), but it is not limited thereto. In some embodiments, the conductive pad 159 may be formed of a conductive layer, and the auxiliary electrode 155 and/or the auxiliary electrode 155' by formed by the same conductive layer, but it is not limited thereto. In some embodiments, the conductive portion 152' may be in direct contact with the connection portion 158 to form an electric connection, the conductive portion 152' may be electrically connected to the conductive portion 117 via the connection portion 158, thereby electrically connecting the auxiliary electrode 155 and the auxiliary electrode 155', but it is not limited thereto. In other embodiments (not shown), the electric connection between the conductive portion 152' and the conductive portion 117 through a conductive material may be possible after the formation of a via hole (not shown) which is filled with the conductive material (not shown), the conductive portion 152' may be electrically connected to the conductive portion 117, but it is not limited thereto. As mentioned above, the design of the configuration of the conductive portion 152', the connecting portion 158, the conductive portion 117 and/or the auxiliary electrode 155' in the non-display area 106 may facilitate the repair of the circuit, but it is not limited thereto. In some embodiments, the first sealing layer 160 may be provided on the conductive portion 152', the connecting portion 158 and/or the conductive portion 117 to reduce the damage or the risk of water and oxygen penetration of the conductive portion 152', the connecting portion 158, the conductive portion 117 and/or other elements provided under the first sealing layer 160. It should be noted that, the auxiliary electrode 155 and/or the auxiliary electrode 155' may be electrically connected to the conductive pad 159 in other cross-sectional structure although it is not illustrated in FIG. 12.

Figure 13A:
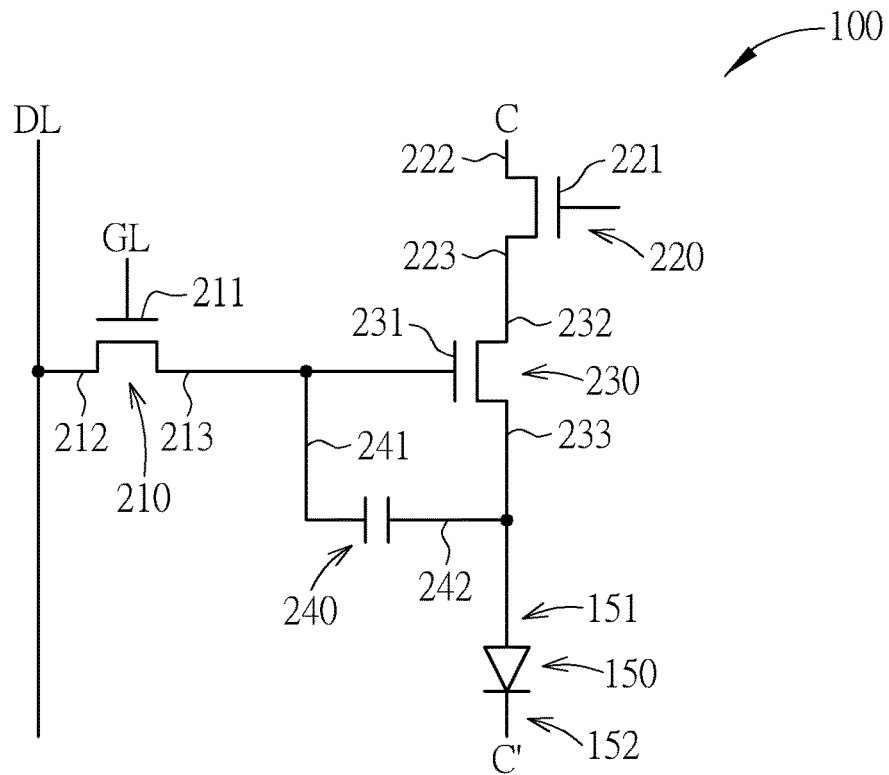
FIG. 13A is a schematic diagram of NMOS type circuit of the display device according to an embodiment of the present disclosure.
Figure 13B:
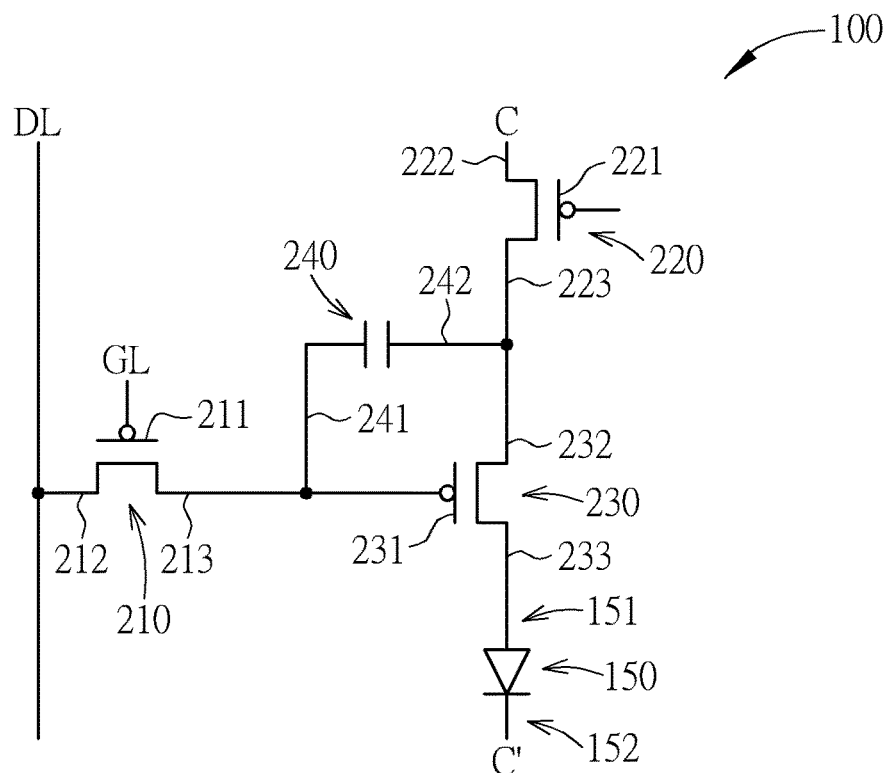
FIG. 13B is a schematic diagrams of PMOS type circuit of the display device according to an embodiment of the present disclosure.

Please continue to refer to FIG. 13A and FIG. 13B. FIG. 13A and FIG. 13B are schematic diagrams of equivalent circuits of the display device 100 according to various embodiments of the present disclosure. FIG. 13A illustrates a schematic diagram of an NMOS type circuit of the display device, and FIG. 13B illustrates a schematic diagram of a PMOS type circuit of the display device. FIG. 13A and FIG. 13B may respectively show three transistors, such as a first transistor 210, a second transistor 220, a third transistor 230 (corresponding to the aforementioned thin film transistor 120) and/or a storage capacitor 240, but it is not limited thereto. In other embodiments, the number of transistors and/or capacitors may be increased or decreased according to requirements, and other circuit elements may be selectively added. In some embodiments, the first transistor 210 may include a gate 211, a source 212 and a drain 213; the second transistor 220 may include a gate 221, a source 222 and a drain 223; the third transistor 230 may include a gate 231, a source 232 and a drain 233; the storage capacitor 240 includes a first electrode 241 and a second electrode 242, but it is not limited thereto. In FIG. 13A, the gate 211 of the first transistor 210 may be electrically connected to the gate line GL, the source 212 of the first transistor 210 may be electrically connected to the data line DL. The source 222 of the second transistor 220 may be electrically connected to the power terminal C (such as ELVDD, but not limited to this). The gate 231 of the third transistor 230 may be electrically connected to the drain 213 of the first transistor 210, the source 232 of the third transistor 230 may be electrically connected to the drain 223 of the second transistor 220, the drain electrode 233 of the third transistor 230 may be electrically connected to the anode 151 of the blue organic light emitting diode 150, the cathode 152 of the blue organic light emitting diode 150 may be electrically connected to the power terminal C'(such as ELVSS, but not limited to this), but it is not limited thereto. The connection relationship between the components may be adjusted according to practice of the circuit. In some embodiments, the first electrode 241 of the storage capacitor 240 may be electrically connected to the gate electrode 231 of the third transistor 230 and/or to the drain electrode 213 of the first transistor 210, but it is not limited thereto. In some embodiments, the second electrode 242 of the storage capacitor 240 may be electrically connected to the drain electrode 233 of the third transistor 230, but it is not limited thereto.

The electrical connection shown in FIG. 13B is slightly different from the electrical connection shown in FIG. 13A. The difference is that the electrical connection of one electrode of the storage capacitor 240 is different. For example, the first electrode 241 of the storage capacitor 240 may be electrically connected to the drain 213 of the first transistor 210 and/or the gate 231 of the third transistor 230, the second electrode 242 of the storage capacitor 240 may be electrically connected to the drain 223 of the second transistor 220 and/or to the source 232 of the third transistor 230, but it is not limited thereto.

This disclosure proposes a variety of possible embodiments. In some embodiments, a configuration may simplify the manufacturing process when the first electrode and/or the second electrode of the storage capacitor and other electrodes of the display device (for example the gate electrode, the drain electrode, the source electrode or the shielding metal layer) are formed of the same conductive layer. In some embodiments, it may facilitate the design flexibility of the first electrode and/or the second electrode when the first electrode and/or the second electrode of the storage capacitor and other electrodes (for example the gate electrode, the drain electrode, the source electrode or the shielding metal layer) of the display device are formed of different conductive layers.

The present disclosure also proposes an auxiliary electrode integrated into the stack structure of the display device to reduce the problem of insufficient driving voltage or IR drop. In some embodiments, the design of the auxiliary electrode does not overlap the blue organic light emitting diode 150 and/or the storage capacitor 130 to reduce the shielding of the light emitted from the blue organic light emitting diode 150 caused by the auxiliary electrode 155, or to reduce the opportunity of the auxiliary electrode 155 interfering with the storage capacitor 130. In some embodiments, a configuration may simplify the manufacturing process when the auxiliary electrode 155 is formed of the same conductive layer as other electrodes of the display device (for example the gate electrode, the drain electrode, the source electrode or the shielding metal layer). In some embodiments, it may facilitate the design flexibility of the auxiliary electrode 155 when the auxiliary electrode 155 is formed of a conductive layer which is different from that of other electrodes of the display device (for example the gate electrode, the drain electrode, the source electrode, or the shielding metal layer).

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a substrate;
    a first inorganic layer disposed on the substrate;
    a thin film transistor disposed on the first inorganic layer, comprising a semiconductor, a gate electrode overlapping the semiconductor, a source electrode and a drain electrode electrically connected with the semiconductor;
    a storage capacitor comprising a first electrode and a second electrode, the first electrode electrically insulated from the second electrode and overlapped with the second electrode;
    a first organic layer disposed on the thin film transistor, comprising a contact via;
    a second inorganic layer disposed between the gate electrode and the semiconductor;
    a third inorganic layer disposed between the source electrode and the gate electrode;
    a light emitting diode comprising an anode, a cathode, and a light emitting layer disposed therebetween, the light emitting layer electrically connected with the anode and the cathode, the anode electrically connected with the source electrode through the contact via;
    a first sealing layer disposed on the light emitting diode;
    a wavelength conversion layer disposed on the first sealing layer; and
    a blue light blocking layer disposed on the wavelength conversion layer; wherein the second electrode of the storage capacitor is disposed between the third inorganic layer and the first organic layer, wherein the first inorganic layer, the second inorganic layer and the third inorganic layer are configured to serve as a dielectric layer of the storage capacitor.

2. The display device of claim 1, wherein the first electrode and the gate electrode are formed of a same conductive layer.

3. The display device of claim 1, wherein the second electrode and the source electrode are formed of a same conductive layer.

4. The display device of claim 1, wherein the gate electrode is disposed on the semiconductor.

5. The display device of claim 1, wherein the source electrode and the drain electrode are disposed on the gate electrode.

6. The display device of claim 1, wherein the second electrode is disposed on the second inorganic layer.

7. The display device of claim 1, wherein the first electrode is disposed between the second inorganic layer and the third inorganic layer.

8. The display device of claim 1, wherein the first electrode is disposed between the substrate and the first inorganic layer.

9. A display device, comprising:
    a substrate;
    a first inorganic layer disposed on the substrate;
    a thin film transistor disposed on the first inorganic layer, comprising a semiconductor, a gate electrode overlapping the semiconductor, a source electrode and a drain electrode electrically connected with the semiconductor;
    a storage capacitor comprising a first electrode and a second electrode, the first electrode overlapped with the second electrode;
    a first organic layer disposed on the thin film transistor, comprising a contact via;
    a second inorganic layer disposed between the gate electrode and the semiconductor;
    a third inorganic layer disposed between the source electrode and the gate electrode;
    a light emitting diode comprising an anode, a cathode, and a light emitting layer disposed therebetween, the light emitting layer electrically connected with the anode and the cathode, the anode electrically connected with the source electrode through the contact via;
    a first sealing layer disposed on the light emitting diode;
    a wavelength conversion layer disposed on the first sealing layer; and
    a blue light blocking layer disposed on the wavelength conversion layer; wherein the second electrode of the storage capacitor is disposed between the third inorganic layer and the first organic layer, wherein the first electrode is disposed between the substrate and the first inorganic layer, and the first inorganic layer, the second inorganic layer and the third inorganic layer are configured to serve as a dielectric layer of the storage capacitor.

* * * * *